US007648770B2

(12) United States Patent
Tanaka et al.

(10) Patent No.: US 7,648,770 B2
(45) Date of Patent: Jan. 19, 2010

(54) PRIMER, CONDUCTOR FOIL WITH RESIN, LAMINATED SHEET AND METHOD OF MANUFACTURING LAMINATED SHEET

(75) Inventors: Kenji Tanaka, Chikusei (JP);
Kazumasa Takeuchi, Chikusei (JP);
Nobuyuki Ogawa, Chikusei (JP);
Katsuyuki Masuda, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 348 days.

(21) Appl. No.: 10/557,728

(22) PCT Filed: May 21, 2004

(86) PCT No.: PCT/JP2004/007326

§ 371 (c)(1),
(2), (4) Date: Jan. 19, 2007

(87) PCT Pub. No.: WO2005/007756

PCT Pub. Date: Jan. 27, 2005

(65) Prior Publication Data
US 2007/0185297 A1    Aug. 9, 2007

(30) Foreign Application Priority Data
May 21, 2003 (JP) ............................. 2003-143940
May 21, 2003 (JP) ............................. 2003-144059

(51) Int. Cl.
*B32B 15/08* (2006.01)
(52) U.S. Cl. .................. 428/458; 428/457; 428/473.5
(58) Field of Classification Search .................. None
See application file for complete search history.

(56) References Cited

U.S. PATENT DOCUMENTS 6,252,010 B1 *  6/2001  Takeuchi et al. ............ 525/403

FOREIGN PATENT DOCUMENTS

EP           0 913 429           5/1999

(Continued)

OTHER PUBLICATIONS

International Search Report, for International Application No. PCT/JP2004/007326, mailed Nov. 30, 2004.

(Continued)

*Primary Examiner*—Monique R Jackson
(74) *Attorney, Agent, or Firm*—Antonelli, Terry, Stout & Kraus, LLP.

(57) ABSTRACT

The invention aims to provide a resin primer which can stick an insulator layer to a conductor foil whereof the surface is not much roughened with sufficient adhesive force, a conductor foil with resin, a laminated sheet and a method of manufacturing same. The resin primer of the invention comprises a resin having film-forming ability and a breaking energy of 0.15 J or more. The conductor foil with resin of the invention comprises a resin layer comprising a conductor foil and the aforesaid resin primer. Further, the laminated sheet of the invention comprises the conductor foil, an insulating layer disposed facing the conductor foil, and a resin layer comprising the aforesaid resin primer disposed between the conductor foil and insulating layer so that it is in contact therewith. This laminated sheet can be manufactured by heating and pressurizing a laminate comprising the aforesaid conductor foil with resin, and a prepreg laminated on this resin layer.

11 Claims, 5 Drawing Sheets

FOREIGN PATENT DOCUMENTS

| | | |
|---|---|---|
| JP | 47-21592 | 6/1972 |
| JP | 52-126437 | 10/1977 |
| JP | 55-75285 | 6/1980 |
| JP | 58-172819 | 10/1983 |
| JP | 63-083176 | 4/1988 |
| JP | 1-138235 | 5/1989 |
| JP | 01-215818 | 8/1989 |
| JP | 01-268778 | 10/1989 |
| JP | 04-211941 | 8/1992 |
| JP | 08-113646 | 5/1996 |
| JP | 8-325438 | 12/1996 |
| JP | 09-302313 | 11/1997 |
| JP | 10-237411 | 9/1998 |
| JP | 11-130831 | 5/1999 |
| JP | 11-130832 | 5/1999 |
| JP | 11-279482 | 10/1999 |
| JP | 2000-44686 | 2/2000 |
| JP | 2000-345035 | 12/2000 |
| JP | 2001-139809 | 5/2001 |
| JP | 2001-152016 | 6/2001 |
| JP | 2001-164201 | 6/2001 |
| JP | 2002-309166 | 10/2002 |
| JP | 2003-138241 | 5/2003 |
| KR | 2002-0066189 | 8/2002 |

OTHER PUBLICATIONS

"High-density Printed Wiring Board Technologies", Kogyo Chosakai Publishing Co., Ltd., May 20, 1986, pp. 149-157.
Notification of Transmittal of Translation of the International Preliminary Report on Patentability, for International Application No. PCT/JP2004/007326; Date of Mailing: May 23, 2006; 10 pages.
Korean Official Action for Application No. 10-2007-7002347 issued Apr. 27, 2007.
Japanese Official Action issued Oct. 14, 2008, in Application No. 2005-511783.
European Official Action issued Sep. 10, 2009, in Application No. 04734410.6-1217.

* cited by examiner

PRIMER, CONDUCTOR FOIL WITH RESIN, LAMINATED SHEET AND METHOD OF MANUFACTURING LAMINATED SHEET

FIELD OF THE INVENTION

This invention relates to a primer, a conductor foil with resin, a laminated sheet and a method of manufacturing a laminated sheet.

RELATED BACKGROUND OF THE INVENTION

In recent years, with increasing miniaturization and weight-saving of data terminals such as personal computers and cellular phones, more compactness and higher density wiring are coming to be required in the printed circuit boards installed in these devices. In order to satisfy these needs, it is necessary to make the wiring width narrower and to make the gaps between the wiring closer. To match the higher processing speeds of electronic devices, it is also required to increase the number of inputs and outputs with which these electronic devices are provided.

To meet these demands, the mounting of elements on printed circuit boards changed from the pin intercalation type to the surface-mounted type, and then to the area array type represented by a BGA (ball grid array) which uses a plastic substrate. In a substrate on which a bear chip such as a BGA is mounted directly, the chip connections are often made by wire bonding using thermal supersonic waves with application of pressure. It is also required to increase the number of terminals connected by this wire bonding or to make the terminals narrower.

In the prior art, the substrate of these printed circuit boards consisted of a laminate obtained by superimposing a predetermined number of prepregs or the like having a matrix of an electrically insulating resin, and forming them into one piece by the action of heat and pressure. The electrically insulating resin was generally a thermosetting resin such as a phenol resin, epoxy resin, polyimide resin or bis-maleimide-triazine resin. A thermoplastic resin such as a fluororesin or polyphenylene ether resin may also be used.

As the method of forming the conductor circuit on the printed circuit board, the subtractive method is widely used. In this method, a conducting foil such as a metal foil is laminated on a surface (one side or both sides) of the aforesaid laminate, and heat and pressure are applied to form a one-piece conductor-clad laminated sheet. A circuit pattern is then formed by removing the conductor foil on this conductor-clad laminated sheet by etching.

In this conductor-clad laminated sheet, to prevent peeling of the circuit pattern, it is desirable that the conductor foil and insulator layer comprising the laminate of prepregs are firmly stuck together. For this purpose, in the prior art, the adhesive force between the conductor foil and insulator layer was increased by roughening the surface of the foil so as to produce an anchor effect of the resin in the insulator layer as disclosed in JP-A No. 04-211941 or "High-Density Circuit Boards" (by Electronic Material Group Editorial Dept., Kogyo Chosakai, 20 May, 1986, p. 149-157).

DISCLOSURE OF THE INVENTION

However, when the Inventors studied this problem, when etching was performed to remove part of the conductor foil in a conductor-clad laminated sheet with increased adhesive force due to the prior art method, it was discovered that conductor foil easily remained in the part intended to be removed. This was thought to be due to the fact that the etching solution could not easily penetrate the depressions of the roughened conductor foil surface, and therefore it was difficult to fully remove the conductor foil. If conductor foil remains in a part where it is desired to remove the foil, it could cause a short circuit, which is undesirable.

There was also a problem that, due to the "skin effect", it was difficult to increase the frequency of transmitted signals in a printed circuit board obtained using a conductor foil with a roughened surface. Here, "skin effect" refers to the fact that interference of the magnetic force lines produced in the center part of the conductor becomes larger, the higher the frequency of the signal flowing through the conductor, so it is more difficult for current to flow through the center part of the conductor, and the current flowing near the conductor surface increases. If the surface of the conductor foil is roughened when this skin effect occurs, electrical resistance will increase also near the surface, so current tends to flow with more difficulty. Hence, it is more difficult to achieve a high signal frequency, the rougher the surface of the conductor foil is.

Further, when the wiring density of the printed circuit board described above increases, the number of terminals of circuit board elements increases and the terminal width is made narrower, the contact surface area between the circuit pattern and a base material becomes smaller. Due to the decrease of contact surface area, adhesion between the circuit pattern and base material decreases, and the conductor foil peels away easily from the base material. Therefore, when the aforesaid prior art technology was applied, it was difficult to obtain a printed circuit board which could meet the demands of compactness and high-density wiring.

It is therefore an object of the present invention, which was conceived in view of the aforesaid situation, to provide a resin primer which can stick, with sufficient adhesive force, an insulator layer to a conductor foil whereof the surface is not much roughened, as well as to provide a conductor foil with resin, a laminated sheet and a method of manufacturing same.

To achieve the above object, the resin primer of the invention comprises a resin which has film-forming ability and a breaking energy of 0.15 J or more.

Here, the "breaking energy" of the resin is defined and measured as follows. First, the resin is made into a strip-like film of width 10 mm and thickness 50 μm. Next, the strip-like film is pulled out at a speed of 5 mm/min in the length direction until it breaks. At this time, the relation between the tensile stress applied to the strip-like film and the distortion of the film (elongation) can be expressed by a stress-strain curve as shown in FIG. 1. The shaded part in this FIG. 1, i.e., the integral value of the tensile stress until the strip-like film breaks (up to the breaking point), shall be defined as "breaking energy."

The Inventors found that, by containing a resin having these properties, the primer of the invention increased the adhesive force between the conductor foil and insulator layer. The exact reason is still not clear, but the Inventors have speculated as follows.

When the resin obtained from the resin primer is interposed between the conductor foil and insulator layer, the conductor foil can separate from the laminated sheet in the following two ways (1) and (2):

(1) The conductor foil peels away from the insulator layer due to a cohesive failure of resin, (2) The conductor foil and resin peel away from each other.

However, since a resin having the above properties would have a high resistance to cohesive failure, peeling of type (1) would not occur easily.

The stress generated in the resin having these properties is probably widely distributed when the resin is pulled. Therefore, with such a resin, even if a force is applied to peel the conductor foil away, the force per unit contact surface area with the conductor foil is small, so peeling of type (2) would also be largely suppressed.

Another resin primer according to the invention contains a resin wherein, when this resin is formed into a film, the 10 point average roughness on the surface of this film (symbol 2 in FIG. 2) is adjusted to 0.1 μm or less and formamide solution (symbol 1 in FIG. 2) is dripped on the surface of this film at room temperature, the contact angle (θ in FIG. 2) of the formamide solution with respect to the film surface is 60° or less.

The Inventors found that, by containing a resin having these properties, the primer of the invention increased the adhesive force between the conductor foil and insulator layer. The exact reason is still not clear, but the Inventors have speculated as follows. The molded product of the resin having the properties described above probably has a high surface free energy. Therefore, when the resin is stuck to the conductor foil, the interaction (attraction) of the interface between the resin and conductor foil is large. The Inventors consider that due to this, there is a high adhesive force between the conductor foil and insulator layer.

In the resin layer obtained from these primers, peeling of the conductor foil away from the laminated sheet can be adequately suppressed. It is therefore possible to manufacture a printed circuit board of higher density and superior high frequency properties using these primers. In the case of a primer containing a resin having both of these properties, compared with primers respectively having each individual property, the adhesive force between the insulator layer and conductor foil can be further enhanced.

The primer of the invention preferably comprises a resin containing 6 mass % or more of at least one bond selected from among a group comprising imide, carbamate and aromatic carboxylic acid ester, based on the mass of the resin in the primer. By using such a primer, the adhesive force between the conductor foil and insulator layer is still further increased.

The other resin primer of the invention comprises a resin containing a polyamideimide having a siloxane structure in the main chain wherein, when the content of all amide groups in the main chain is A wt % and the content of all silicon atoms in the resin is C wt %, the following equations (a) and (b) are satisfied:

$$3 \leq A \leq 11 \quad (a)$$

$$1 \leq C \leq 16 \quad (b).$$

The resin primer which satisfies the aforesaid conditions containing a polyamideimide having a siloxane structure in the main chain, shows superior adhesion also with respect to a metal foil having a relatively smooth surface.

This resin primer comprises the aforesaid resin having film-forming ability and a breaking energy of 0.15 J or more, and/or when it is formed into a film having a 10 point average roughness of 0.1 μm or less, the formamide contact angle at room temperature with respect to the film surface may be 60° or less.

Another resin primer of the invention comprises a resin containing a polyamideimide having a siloxane structure in the main chain, and a reactive compound which has a functional group which reacts with the amide groups in this polyamideimide and which may have an amide group and/or a silicon atom. When the amide group content in the polyamideimide is Pa wt %, the amide group content in the reactive compound is Ea wt %, the silicon atom content in the polyamideimide is Pc wt % and the silicon atom content in the reactive compound is Ec wt %, the wt parts B in the reactive compound relative to 100 wt parts of polyamideimide in the resin may satisfy the following equations (I) and (II):

$$3 \leq (Pa \times 100 + Ea \times B)/(100+B) \leq 11 \quad (I)$$

$$1 \leq (Pc \times 100 + Ec \times B)/(100+B) \leq 16 \quad (II).$$

In addition to the polyamideimide having a siloxane group in the main chain, by further containing the aforesaid reactive compound, the adhesiveness of the resin layer of the resin primer can be further enhanced, and the heat-resistance can also be improved. Moreover, if the blending proportion of this reactive compound is adjusted as described above, the amide group content and silicon atom content in the aforesaid resin easily come to lie within the aforesaid preferred ranges. As a result, a resin primer which demonstrates even better adhesiveness is obtained.

As for the form of the resin primer, when it comprises the aforesaid resin having film-forming ability and a breaking energy of 0.15 J or more, and/or when the resin is formed into a film having a 10 point average roughness of 0.1 μm or less, the formamide contact angle at room temperature with respect to the film surface may be 60° or less.

More specifically, the polyamideimide having a siloxane structure in the main chain described above, is preferably obtained by the reaction of a diimide-dicarboxylic acid mixture, this mixture containing a diimide-dicarboxylic acid expressed by the following general formula (1) obtained by reacting an aromatic diamine and anhydrous trimellitic acid, and a diimide-dicarboxylic acid expressed by the following general formula (2) obtained by reacting a siloxane diamine and anhydrous trimellitic acid, with an aromatic diisocyanate expressed by the following general formula (3):

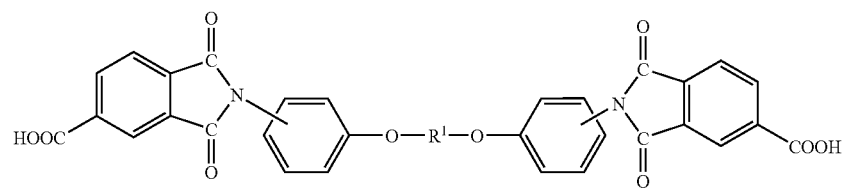

(1)

-continued

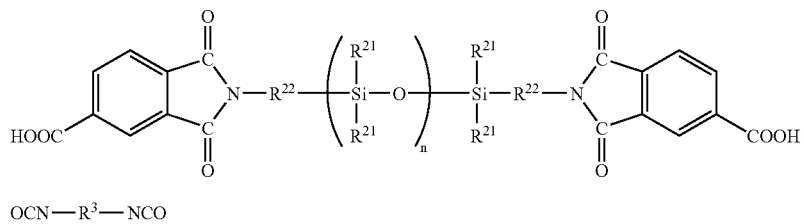

(2)

OCN—R³—NCO (3)

[in the formulae, $R^1$ is a divalent group expressed by the following general formula (4a) or following general formula (4b), $R^{21}$ is an alkyl group, phenyl group or substituted phenyl group, $R^{22}$ is a divalent organic group, $R^3$ is a divalent organic group having at least one aromatic ring, and n is an integer from 1-50.

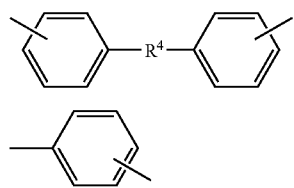

(4a)

(4b)

where, in formula (4a), $R^4$ is an alkylene group having 1-3 carbon atoms, a halogenated alkylene group having 1-3 carbon atoms, a sulfonyl group, an ether group, a carbonyl group or a single bond. The plural $R^{21}$, $R^{22}$ may be respectively identical or different, and the aromatic rings in each compound may further have a substituent group.

This polyamideimide is preferably obtained by a reaction between 1.0-1.5 molar amounts of aromatic diisocyanate more than the total molar amount of diimide-dicarboxylic acid mixture. In this case, the diimide-dicarboxylic acid mixture is obtained by reacting a diamine mixture containing an aromatic diamine and a siloxane diamine with anhydrous trimellitic acid, and it is more preferred that in this diamine mixture, aromatic diamine/siloxane diamine is 0/100-99.9/0.1 in terms of molar ratio.

Another resin primer of the invention comprises a resin containing a polyamideimide having a structural unit containing a saturated hydrocarbon. Here, the structural unit containing the saturated hydrocarbon is preferably expressed by the following chemical formula (5):

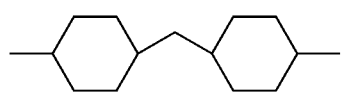

(5)

In this resin primer, the resin has a film-forming ability and a breaking energy of 0.15 J or more, and/or when it is formed into a film having a 10 point average roughness of 0.1 μm or less, the formamide contact angle at room temperature with respect to the film surface may be 60° or less.

The polyamideimide contained in the resin of the resin primer of this type is preferably obtained by reacting the diimide-dicarboxylic acid obtained by reacting a diamine compound and anhydrous trimellitic acid with a diisocyanate, the diamine compound preferably being expressed by the following general formulae (6a), (6b) or (6c):

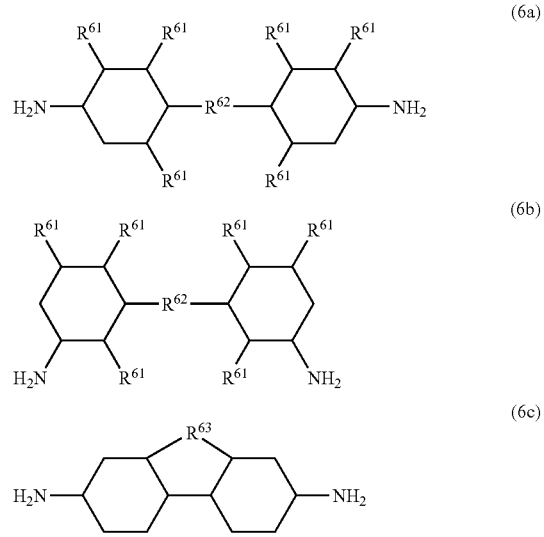

[in the formulae, $R^{61}$ is a hydrogen atom, or a hydroxyl, methoxy, methyl or halogenated methyl group, $R^{62}$ is one of the groups expressed by the following general formulae (7a), (7b), (7c) or (7d), i.e., an alkylene group having 1-3 carbon atoms, a halogenated alkylene group having 1-3 carbon atoms, a sulfonyl group, an ether group, a carbonyl group or a single bond, and $R^{63}$ is an alkylene group having 1-3 carbon atoms, a halogenated alkylene group having 1-3 carbon atoms, a sulfonyl group, an ether group or a carbonyl group:

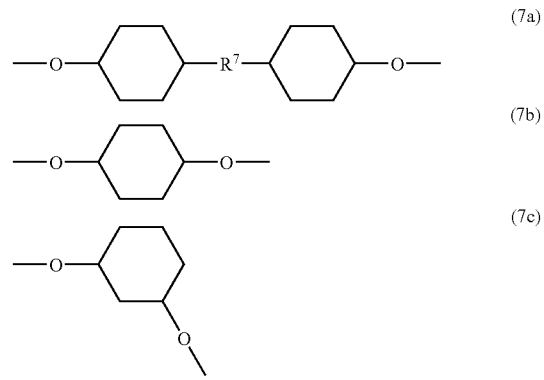

-continued

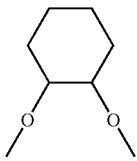
(7d)

where, in formula (7a), $R^7$ is an alkylene group having 1-3 carbon atoms, a halogenated alkylene group having 1-3 carbon atoms, a sulfonyl group, an ether group, a carbonyl group or a single bond. The plural $R^{61}$ may be respectively identical or different].

This polyamideimide is more preferably obtained by further containing the compound expressed by the following general formula (8) as the aforesaid diamine compound:

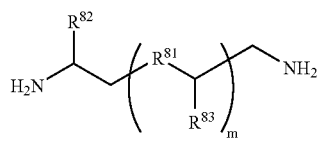
(8)

[in the formula, $R^{81}$ is a methylene group, a sulfonyl group, an ether group, a carbonyl group or a single bond, $R^{82}$, $R^{83}$ are respectively a hydrogen atom, an alkyl group, a phenyl group or a substituted phenyl group, and m is an integer from 1-50].

The diisocyanate used in the synthesis of this polyamideimide is preferably an aromatic diisocyanate.

It is still more preferred that the resin which is contained in the resin primer of this type contains a reactive compound having a functional group which reacts with the amide groups of the polyamideimide.

The resin primer of the invention contains the aforesaid resin, and in addition to this resin may further contain a rubber composition. It is more preferred that the content of this rubber composition is 40 mass % or more based on the mass of resin. With a resin primer containing such a rubber composition, the adhesion of the conductor foil and insulator layer can be further enhanced.

The conductor foil with resin according to the invention is characterized in comprising a conductor foil and a resin layer provided on this conductor foil, the 10 point average roughness of the surface of the conductor foil being 3 μm or less, and the resin layer being formed by coating with the resin primer of the invention. The conductor foil with resin according to the invention is further characterized in comprising a conductor foil and a resin layer provided on this conductor foil, the conductor foil being a metal foil, and the resin layer being formed from the resin primer of the invention.

Since the conductor foil with resin has a resin layer formed by the aforesaid resin primer of the invention, although the surface of the conductor foil is quite smooth, the adhesive force between the conductor foil and insulator layer is sufficiently high. Therefore, this conductor foil with resin is suitable for manufacturing a high-density printed circuit board. Moreover, since the surface of the conductor foil is smooth as described above, if this conductor foil with resin used, there is little current increase near the surface due to aforementioned skin effect, and a printed circuit board which can cope also with high frequency transmission signals can be manufactured.

The invention also provides a laminated sheet which can be used as the substrate of a printed circuit board, and which is obtained using the aforesaid resin primer. Specifically, the laminated sheet of the invention is characterized in that it is obtained by heating and pressurizing a laminate comprising the aforesaid conductor foil with resin of the invention and prepregs laminated on the resin layer of this conductor foil with resin.

The laminate thus obtained comprises the conductor foil, the insulating layer comprising a resin disposed opposite this foil, and the resin layer comprising the aforesaid resin primer of the invention provided between the conductor foil and insulating layer so that it is in contact therewith. Therefore, in this laminate, the 10 point average roughness of at least the surface of the conductor foil in contact with the resin layer is 3 μm or less.

A laminate having this construction can be conveniently manufactured by heating and pressurizing a laminate, comprising the conductor foil with resin of the invention, and prepregs laminated on a layer formed by coating the conductor foil with resin, with the resin primer.

BEST MODES FOR CARRYING OUT THE INVENTION

Hereafter, a suitable embodiment of the invention will be described in detail.

[Resin Primer]

First, a resin primer of the invention will be described. The resin primer of the invention contains a resin. This resin may for example have film-forming ability and a breaking energy equal to 0.15 J or more.

Here, the method of measuring the "breaking energy" of the resin is as follows. First, the resin is made into a strip-like film of width 10 mm and thickness 50 μm. Specifically, a resin solution of one, two or more kinds is applied to the glossy surface (Rz=2 μm) of a copper foil so that the film thickness after drying is 50 μm, and dried.

Next, another copper foil is laminated on the surface of the resin of the copper foil with resin which is not yet in contact with copper foil so that it faces the glossy surface, and the laminate is pressed from the side of the copper foil not in contact with the resin layer. The copper foil on both surfaces of the resin layer is then removed by etching, and cut to a width of 10 mm so as to obtain a short strip-like film. At this time, the length of the film is preferably longer than the distance between grips before the film was pulled, i.e., 60 mm.

Next, the two grips are disposed so as to grip the film at 60 mm distance from each other in the length direction. The two grips are then moved away from each other at a speed of 5 mm/minute in the length direction of this film, so as to pull the film. This pulling is continued until the film breaks.

Figure 1:
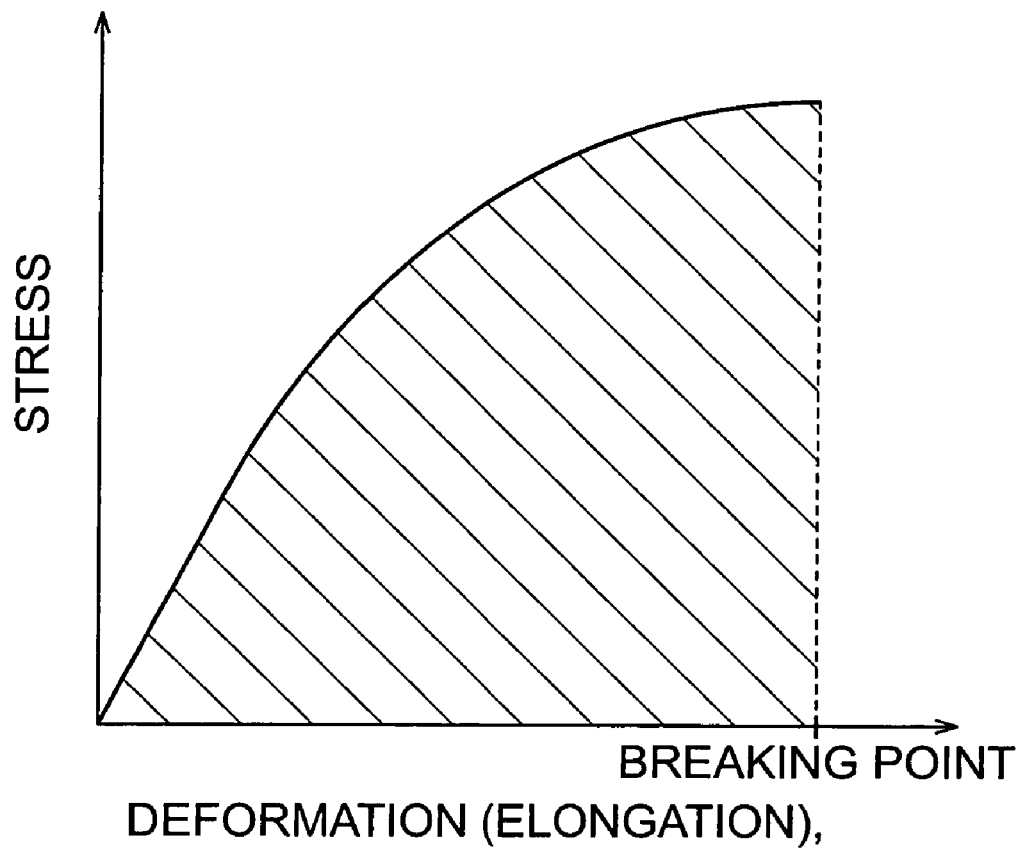
FIG. 1 is a diagram showing a resin stress-strain curve.

The relation between the pulling force given to the short strip-like film and the deformation (elongation) of the film may be expressed by a stress-strain curve shown in FIG. 1. The shaded part in FIG. 1, i.e., the integral value of the pulling stress until the short strip-like film breaks (up to the breaking point) is calculated, and this value is defined as the "breaking energy (units: J)".

The measurement may be performed for example using an Autograph AG-100C (Shimadzu Corporation, commercial name), and the breaking energy can be computed from the stress-strain curve thus obtained.

Figure 2:
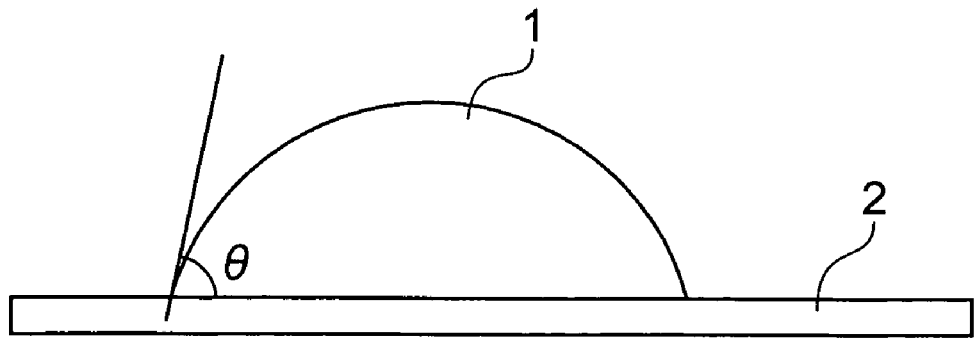
FIG. 2 is a diagram showing the contact angle of a formamide solution on a resin surface.

As for the resin, when the resin is film-like, the 10 point average roughness (Rz) on the surface of the resin film (symbol 2 in FIG. 2) is preferably adjusted to 0.1 µm or less, and if formamide solution (1 in FIG. 2) is dripped on the resin film surface at room temperature, the contact angle (θ in FIG. 2) (hereafter, "formamide contact angle") of the formamide solution relative to the resin film surface is preferably 60° or less.

This formamide contact angle can be measured by the prior art method, for example, it can be measured using a contact angle measuring device CA-DT (Kyowa Surface Science Co., trade name).

Here, the "10 point average roughness" of the resin film surface described above can be derived by the measurement method according to JIS B0601-1994, for example using a commercial needle contact surface roughness gauge.

The resin contained in the resin primer of the embodiment is not particularly limited, and may be a resin having any of the aforesaid properties. Examples are thermosetting resins such as phenol resins, epoxy resins, polyimide resins and bis-maleimide-triazine resin. Thermoplastic resins such as fluororesins and polyphenylene resins may also be mentioned. One of these may be used alone, or two or more may be used together.

The resin is preferably a resin containing 6 mass % or more of one or more bonds selected from a group comprising an imide bond, carbamate bond and aromatic carboxylic acid ester bond based on the mass of the resin. In the invention, "mass %" or "mass parts" is effectively identical to a weight-based value ("wt %" or "wt parts") (hereafter, idem).

Here, the content of the aforesaid bonds will be described. It is assumed that "imide bond" comprises one nitrogen atom and two carbonyl bonds (C=O), "carbamate bond" comprises one nitrogen atom and one ester bond (COO), and "aromatic carboxylic acid ester bond" comprises one ester bond (COO).

The mass of each bond is computed by multiplying the atomic weight sum of the atoms forming the bond by the number of moles of the bond. From the above, the atomic weight sum of the atoms forming the bond is 70 for an imide bond, 58 for a carbamate bond and 44 for an aromatic carboxylic acid ester bond. The content (mass %) of each bond is expressed by the proportion (mass %) of the bond relative to the total mass of resin solids when the resin reaction (condensation reaction or polycondensation reaction) is complete, and can be computed from the blending amount of resin. It is assumed that a solvent or filling agent which does not react with the resin component is not contained in this resin solids content.

The compound (resin) having such bonds has the property of reducing the formamide contact angle described above. Specific examples of this resin are polyimide, polyether imide, polyamideimide, polyurethane, polyarylate and these denatured resins. These resins may be a resin having a breaking energy of 0.15 J or more, and may be a resin having a 60° formamide contact angle.

The resin contained in the resin primer may be the first resin and second resin shown below, and other resins may also be used. Among these, a resin containing a polyamideimide such as the first resin and second resin is preferred. It is more preferred that these resins have the aforesaid breaking energy property and/or formamide contact angle property. The resin may contain one of the following alone, or plural moieties together.

Hereafter, the first resin, second resin, other resin and ingredients other than resins contained in the resin primer of this embodiment, will be described.

(First Resin)

First, a first embodiment will be described. The first resin contains a polyamideimide having a siloxane bond in the main chain. When the amide group content of the resin is A wt %, and the silicon atom content of the resin is C wt %, the resin preferably satisfies the aforesaid equations (a) and (b).

Here, when the amide group content and silicon atom content are not within the aforesaid ranges, the bond strength of the conductor-clad laminated sheet obtained decreases, and also heat resistance is poorer. The preferred range for A is 6-9, and the preferred range for C is 5-12.

More preferably, the first resin, in addition to the polyamideimide having a siloxane structure in the main chain, contains a reactive compound having a functional group which reacts with the amide groups of this polyamideimide.

When this reactive compound is further contained, the content thereof preferably satisfies the following conditions. If the amide group content of the polyamideimide is Pa wt %, the amide group content in the amide reactive compound is Ea wt %, the silicon atom content of the polyamideimide is Pc wt % and the silicon atom content of the reactive compound is Ec wt %, the wt parts B of reactive compound relative to 100 wt parts polyamideimide preferably satisfies the aforesaid equations (I) and (II).

When the blending proportions of each ingredient of the resin satisfy the aforesaid equations (I) and (II), the total amide group amount and total silicon amount come to lie within the limits of the aforesaid equations (a) and (b), the bond strength of the conductor foil and insulating layer in the conductor-clad laminated sheet obtained using this resin is further improved, and heat resistance is excellent. On the other hand, if the blending proportions of each ingredient do not satisfy the aforesaid equations (I) and (II), these properties are poorer. From the viewpoint of further improving these properties, the lower limit of $(Pa \times 100 + Ea \times B)/(100+B)$ in the aforesaid equation (1) is preferably 6, and the upper limit is preferably 9. From the same viewpoint, the lower limit of $(Pc \times 100 + Ec \times B)/(100+B)$ in the aforesaid equation (II) is 5, and the upper limit is 12.

The resin primer containing the resin satisfying these conditions not only has excellent adhesion to the metal foil, but also has excellent heat resistance. This is mainly due to the polyamideimide into which a siloxane structure was introduced which has a high heat resistance. The polyamideimide of this composition not only has good adhesion to the metal foil, but at a temperature at which the resin does not harden, the residual organic solvent in the resin can be reduced to 5 wt % or less very easily. If the residual organic solvent in the resin is reduced to 5 wt % or less, swelling due to volatilization of the organic solvent does not easily occur even if the adhesive layer is exposed to high temperature by subsequent steps such as soldering.

The polyamideimide having a siloxane structure in the main chain, has a siloxane structure, amide bond and imide bond in the main chain. Here, siloxane structure means a group having a —SiO— bond. As the siloxane structure, a structure wherein two monovalent organic groups are combined with a silicon atom is preferred.

This polyamideimide is preferably obtained by reacting a diimide-dicarboxylic acid mixture containing the diimide-dicarboxylic acid (hereafter, "first diimide-dicarboxylic acid") expressed by the aforesaid general formula (1) obtained by reacting an aromatic diamine and anhydrous trimellitic acid), the diimide-dicarboxylic acid (hereafter, "second diimide-dicarboxylic acid") expressed by the aforesaid general formula (2) obtained by reacting a siloxane diamine and anhydrous trimellitic acid, and the aromatic diisocyanate expressed by the aforesaid general formula (3).

Here, in the first diimide-dicarboxylic acid, the functional group expressed by $R^1$ in the aforesaid general formula (1) is preferably a divalent group expressed by the aforesaid formula (4a). In this case, the functional group expressed by $R^4$ in the aforesaid formula (4a) is a group expressed by —C($CH_3$)$_2$— or a group expressed by —C($CF_3$)$_2$—.

The aromatic diamine for forming this first diimide-dicarboxylic acid may for example be 2,2-bis[4-(4-aminophenoxy)phenyl]propane (BAPP), bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4'-bis(4-aminophenoxy)biphenyl, bis[4-(4-aminophenoxy)phenyl]ether, bis[4-(4-aminophenoxy)phenyl]ketone, 1,3-bis(4-aminophenoxy)benzene or 1,4-bis(aminophenoxy)benzene. Among these, BAPP is preferred.

In the second diimide-dicarboxylic acid, in the aforesaid formula (2), $R^{21}$ is preferably an alkyl group having 1-6 carbon atoms but more preferably an alkyl group having 1-3 carbon atoms, and $R^{22}$ is preferably an alkylene group having 1-6 carbon atoms but more preferably an alkylene group having 1-3 carbon atoms.

The siloxane diamine for forming these second diimide-dicarboxylic acids is preferably a dimethylsiloxane biterminal amine. This compound is commercially available as the amino-modified silicone oils X-22-161AS (amine equivalent 450), X-22-161A (amine equivalent 840), X-22-161B (amine equivalent 1500) (all from Shin-Etsu Chemical Industries Co., Ltd.), and BY16-853 (amine equivalent 650), BY-16-853B (amine equivalent 2200) (both from Dow Corning Toray Silicone Co., Ltd.). These may be used alone, or may be used together.

The diimide-dicarboxylic acid mixture containing these first and second diimide-dicarboxylic acids may be prepared by method (A) After first synthesizing each diimide-dicarboxylic acid beforehand, the two are mixed together or method (B) After mixing the aromatic diamine and siloxane diamine for forming the diimide-dicarboxylic acid to make a diamine mixture, anhydrous trimellitic acid is reacted with this mixture.

When method (B) is used, the blending proportions of aromatic diamine, siloxane diamine and anhydrous trimellitic acid preferably satisfy the following condition. The ingredients must be blended so that, when the number of moles of aromatic diamine is D, the number of moles of siloxane diamine is E and the number of moles of anhydrous trimellitic acid is F, the value of (D+E)/F lies within the range 1.0/2.0-1.0/2.2.

In this case, the mixing ratio D/E of D and E is preferably determined according to the amine equivalent of E, and is usually 99.9/0.1-0/100. Specifically it is preferred that, when for example the amine equivalent of the siloxane diamine is 400-500, D/E is 99.9/0.1-0/100, when the amine equivalent thereof is 800-1000, D/E is 99.9/0.1-60/40, and when the amine equivalent thereof is 1500-1600, D/E is 99.9/0.1-60/40. When D, E, F are arranged to be within these ranges, the ingredient ratio of the first and second diimide-dicarboxylic acids in the diimide-dicarboxylic acid mixture is satisfactory, and it is easy to ensure that the amide group content and silicon atom content in the polyamideimide satisfy the aforesaid equations (a) and (b).

In method (B), the diimide-dicarboxylic acid mixture can be obtained by reacting anhydrous trimellitic acid with the aforesaid diamine mixture. This reaction can be performed by for example dissolving or dispersing the two in an aprotic polar solvent, reacting them at 50-90° C., adding an aromatic hydrocarbon which forms an azeotropic mixture with water to the solution after reaction, and further reacting them at 120-180° C. to cause a dehydration cyclization.

Here, the aprotic polar solvent may be dimethylacetamide, dimethylformamide, dimethyl sulfoxide, N-methyl-2-pyrrolidone, 4-butyrolactone or sulfolane. Among these, N-methyl-2-pyrrolidone is preferred.

The aromatic hydrocarbon which forms an azeotropic mixture may be toluene, benzene, xylene or ethylbenzene, but toluene is preferred. This aromatic hydrocarbon is preferably added in an amount of 0.1-0.5 in terms of weight ratio relative to the aprotic polar solvent. After completing this dehydration cyclization, before performing the reaction with the aromatic diisocyanate described later, the temperature of the solution is preferably increased to about 190° C. to remove the aromatic hydrocarbon which forms an azeotropic mixture with water.

The polyamideimide having a siloxane structure in the main chain can be synthesized by reacting the aromatic diisocyanate expressed by the aforesaid general formula (3) with the diimide-dicarboxylic acid mixture obtained as described above. The aromatic diisocyanate may for example be 4,4'-diphenylmethane diisocyanate (MDI), 2,4-tolylene diisocyanate, 2,6-tolylene diisocyanate, naphthalene-1,5-diisocyanate or 2,4-tolylene dimer.

The polyamideimide thus obtained may for example have a repeating unit expressed by the following general formula (9a) and a repeating unit expressed by the following general formula (9b). These repeating units may be joined together in blocks, or joined together randomly. $R^1$, $R^{21}$, $R^{22}$, $R^3$ and n in the formulae have an identical significance to those given above:

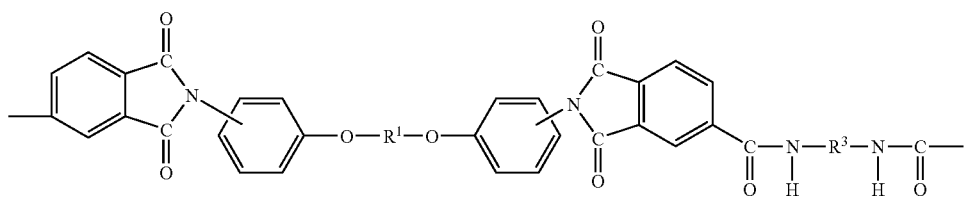

(9a)

-continued

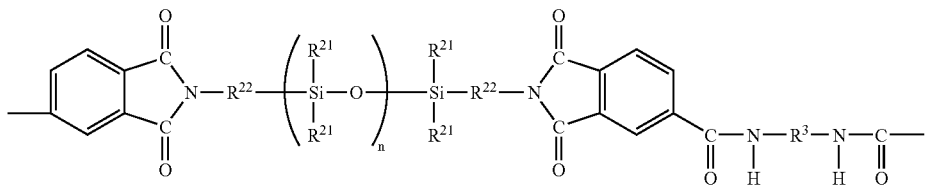

(9b)

In the reaction of the diimide-dicarboxylic acid mixture and aromatic diisocyanate, for example when the solution containing the diimide-dicarboxylic acid is heated to remove the aromatic hydrocarbon as described above, the solution after the reaction is preferably first cooled to room temperature. After adding the aromatic diisocyanate to the cooled solution, the temperature is then increased to about 190° C., and reacted for about 2 hours to obtain the polyamideimide.

In this reaction, the addition amount of the aromatic diisocyanate is preferably 1.0-1.5 molar amounts, but more preferably 1.1-1.3 molar amounts, more than the total molar amount of diimide-dicarboxylic acid mixture. If the addition amount of aromatic diisocyanate is less than 1.0 molar amounts, the flexibility of the resin layer formed from the resin primer tends to decrease, and if it exceeds 1.5 molar amounts, the flexibility of the resin layer likewise tends to decrease.

The reactive compound contained in the first resin may be a thermosetting resin having a functional group which reacts with the amide groups of the polyamideimide described above. This reactive compound may have an amide group and/or a silicon atom in the molecule.

The thermosetting resin may for example be a polyfunctional epoxy compound, polyimide resin, unsaturated polyester resin, polyurethane resin, bis-maleimide resin, triazine-bis-maleimide resin or phenol resin. Among these, a polyfunctional epoxy compound is preferred. When a polyfunctional epoxy compound is used as the reactive compound, adhesion of the resin layer formed from the resin primer containing these compounds to the conductor foil improves, and heat-resistance, mechanical properties and electrical properties are also excellent. As such a polyfunctional epoxy compound, a polyfunctional epoxy compound having two or more epoxy groups is preferred, and a polyfunctional epoxy compound having three or more epoxy groups is more preferred.

The polyfunctional epoxy compound having two or more epoxy groups may for example be an epoxy resin obtained by reacting a polyhydric phenol such as bisphenol A, a novolac phenol resin or an o-cresol novolac phenol resin with epichlorhydrin; an epoxy resin obtained by reacting a polyhydric alcohol such as 1,4-butanediol with epichlorhydrin; a polyglycidyl ester obtained by reacting a polybasic acid such as phthalic acid or hexahydrophthalic acid with epichlorhydrin; a N-glycidyl derivative of an amine, amide or a compound having or a heterocyclic nitrogen base; or an alicyclic epoxy resin.

The polyfunctional epoxy compound having three or more glycidyl groups may for example be commercially available ZX-1548-2 (Toto Kasei Co., Ltd.), DER-331L (Dow Chemical Co. bisphenol A epoxy resin) or YDCN-195 (Toto Kasei cresol novolak epoxy resin), which may conveniently be used.

The blending proportion of the reactive compound in the resin containing the polyamideimide described above is preferably determined by the number of functional groups which react with amide groups in the compound concerned. Specifically, when the amide group content of the polyamideimide is Pa wt %, the amide group content in the reactive compound is Ea wt %, the silicon atom content in the polyamideimide is Pc wt % and the silicon atom content of the reactive compound is Ec wt %, the wt parts B of the reactive compound relative to 100 wt parts of polyamideimide, are determined so as to satisfy the aforesaid equations (I) and (II).

Thus, when the resin contains a polyfunctional epoxy compound as the reactive compound, it is preferable to further add a curing agent or hardening accelerator for this polyfunctional epoxy compound. The curing agent or hardening accelerator may be any of those known in the art. For example, the curing agent may be an amine such as dicyandiamide, diaminodiphenylmethane or guanylurea; an imidazole; a polyfunctional phenol such as hydroquinone, resorcinol, bisphenol A and its halides, novolac phenol resin and resol phenol resin; or an acid anhydride such as phthalic anhydride, benzophenone tetracarboxylic acid dianhydride and methyl hymic acid. The hardening accelerator may be an imidazole such as an alkyl-substituted imidazole or benzimidazole.

The blending proportion of curing agent can be determined according to the epoxy equivalent of the polyfunctional epoxy compound. For example, when adding an amine compound as curing agent, this blending proportion is preferably such that the active hydrogen equivalent of the amine is equal to the epoxy equivalent of the polyfunctional epoxy compound. When the curing agent is a polyfunctional phenol or an acid anhydride, the blending proportion is preferably such that there are 0.6-1.2 equivalents of phenolic hydroxyl groups or carboxyl groups relative to 1 equivalent of the polyfunctional epoxy compound. The blending proportion of the hardening accelerator is preferably 0.001-10 wt parts relative to 100 wt parts of polyfunctional epoxy compound.

When the blending proportion of this curing agent or hardening accelerator is less than the aforesaid range, hardening of the polyfunctional epoxy compound is poor and there is a tendency for the glass transition temperature of the resin layer obtained from the resin primer containing the resin to decrease. On the other hand, when it is more than the aforesaid range, there is a tendency for the electrical properties of the resin layer obtained from the resin primer to decline due to the residual curing agent or hardening accelerator.

In addition to the polyamideimide, reactive compound and curing agent which were described above, the resin containing polyamideimide may further contain a filling agent, coupling agent or flame retarder as additional ingredients.

(Second Resin)

Next, the second resin will be described. The second resin contains a polyamideimide having a structural unit comprising a saturated hydrocarbon. This structural unit preferably has a cycloalkylene group, more preferably has one or two cycloxylene groups, and still more preferably is expressed by the aforesaid chemical formula (5). The resin primer containing this polyamideimide not only has excellent adhesion to the conductor foil, but also has a high Tg and can form a resin layer having excellent moisture resistance and heat-resisting property.

The polyamideimide contained in the second resin is preferably obtained by reacting a diimide-dicarboxylic acid, obtained by reacting a diamine compound having the structural unit described above between two amino groups with anhydrous trimellitic acid, with a diisocyanate.

The diamine compound is preferably a compound expressed by the aforesaid general formula (6a), (6b) or (6c). Specific examples are 2,2-bis[4-(4-aminocyclohexyloxy-)cyclohexyl]propane, bis[4-(3-aminocyclohexyloxy-) cyclohexyl]sulfone, bis[4-(4-aminocyclohexyloxy-)cyclohexyl]sulfone, 2,2-bis[4-(4-aminocyclohexyloxy-)cyclohexyl]hexafluoropropane, bis[4-(4-aminocyclohexyloxy-)cyclohexyl]methane, 4,4'-bis[4-aminocyclohexyloxy-]dicyclohexyl, bis[4-(4-aminocyclohexyloxy-)cyclohexyl] ether, bis[4-(4-aminocyclohexyloxy-)cyclohexyl]ketone, 1,3-bis(4-aminocyclohexyloxy-)benzene, 1,4-bis(4-aminocyclohexyloxy-)benzene, 2,2-dimethyldicyclohexyl-4,4'-diamine, 2,2-bis(trifluoromethyl)dicyclohexyl-4,4'-diamine, 2,6,2',6'-tetramethyl-4,4'-diamine, 5,5'-dimethyl-2,2'-sulfonyl-dicyclohexyl-4,4'-diamine, 3,3'-dihydroxyldicyclohexyl-4,4'-diamine, (4,4'-diamino)dicyclohexylmethane, (4,4'-diamino)dicyclohexylether, (4,4'-diamino)dicyclohexylsulfone, (4,4'-diamino)dicyclohexylketone, (3,3'-diamino)dicyclohexylether and 2,2-bis(4-aminocyclohexyl)propane. Among these, (4,4'-diamino)dicyclohexylmethane is preferred. These diamine compounds may be used alone, or may be used together.

It is more preferred that the polyamideimide in the second resin is obtained using a diamine compound which, in addition to that described above, is expressed by the aforesaid general formula (8). In the compound expressed by the aforesaid general formula (8), $R^{82}$, $R^{83}$ are respectively a hydrogen atom, an alkyl group having 1-3 carbon atoms, a phenyl group or a substituted phenyl group. The substituent in this substituted phenyl group may be an alkyl group or halogen atom having 1-3 carbon atoms.

It is particularly preferred that, in the compound expressed by the aforesaid general formula (8), the group expressed by $R^{81}$ is an ether group. By containing this diamine compound, the polyamideimide, and as a result the resin primer containing same, comes to have the properties of a low elastic modulus and high Tg. This diamine compound may be commercially available Jeffamine D-400 or Jeffamine D-2000 (San Techno Chemical Co., Ltd.), which are preferred.

In the polyamideimide in the second resin, the diamine compound, in addition to those described above, may be obtained by including an aromatic diamine or a siloxane diamine. In this case, the aromatic diamine and siloxane diamine are not particularly limited, and may be for example those used for synthesis of the polyamideimide in the first resin described above. Due to addition of the aromatic diamine, the Tg of the polyamideimide and therefore the resin primer can be increased which improves heat resistance. Due to the addition of the siloxane diamine, the elastic modulus of the resin primer can be decreased.

The polyamideimide in the second resin can be synthesized for example as follows. The aforesaid diamine compound and anhydrous trimellitic acid are first reacted at 70-100° C. in an aprotic solvent. Here, the aprotic solvent is identical to that used for synthesis of the polyamideimide in the aforesaid first resin, and NMP is preferred.

Here, regarding the content of aprotic polar solvent, it should be such that the weight of solids is 10-70 wt %, but preferably 20-60 wt % relative to the total weight of solution. If the solids content of the solution exceeds 70 wt %, the solubility of solids decreases and the reaction tends to be incomplete. On the other hand, if it is less than 10 wt %, the solvent amount used is excessive which is disadvantageous from a cost viewpoint.

After the aforesaid reaction, in the obtained solution, as in the polyamideimide synthesis of the first resin described above, an aromatic hydrocarbon which can form an azeotropic mixture with water is added and heated to 150-200° C. which causes a dehydration cyclization to obtain a diimide-dicarboxylic acid. Under these conditions, since the aromatic hydrocarbon may distil off simultaneously with outflow of water so it is less than the desired amount, water can be removed from the distillation liquid and the liquid returned to the reaction solution to keep the aromatic hydrocarbon concentration in the solution constant. After completion of dehydration cyclization, the solution is preferably heated to distil off the aromatic hydrocarbon.

The diimide-dicarboxylic acid obtained in this way may be the compound expressed by the following general formula (10a), and when the diamine compound expressed by the aforesaid general formula (8) is used together, the compound expressed by the following general formula (10b) is also produced. In the formulae, $R^{10}$ is a divalent group formed by removing an amino group from the compound expressed by the aforesaid general formula (6a), (6b) or (6c), and $R^{81}$, $R^{82}$, $R^{83}$ and m are identical to the above:

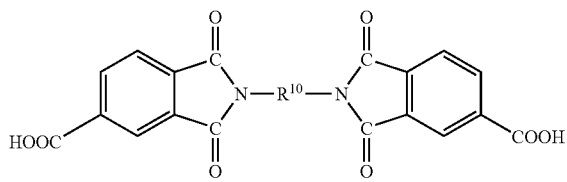

(10a)

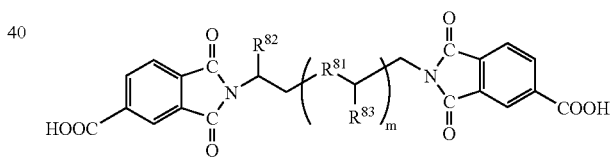

(10b)

The polyamideimide can be obtained by reacting the diimide-dicarboxylic acid obtained as described above with a diisocyanate. When the polyamideimide is synthesized in this way, it is preferred that the blending proportion of diamine compound, anhydrous trimellitic acid and diisocyanate compound is such that diamine compound: anhydrous trimellitic acid: diisocyanate=1:2-2.2:1-1.5 but more preferably 1:2-2.2:1-1.3 in terms of molar ratio. In this case, the syntheses of diimide-dicarboxylic acid and polyamideimide proceed efficiently, and a polyamideimide having a higher molecular weight with superior film-forming property can be obtained.

The diisocyanate may be an aromatic diisocyanate or an aliphatic diisocyanate. The diisocyanate expressed by for example the following general formula (11) is preferred. In the formula, $R^{11}$ is a group expressed by —Ph—$CH_2$—Ph—, a tolylene group, a naphthylene group, a hexamethylene group or an isophorone group:

$$OCN—R^{11}—NCO \qquad (11)$$

The aromatic diisocyanate is preferably identical to that used for polyamideimide synthesis in the first resin described above, and among these, MDI is preferred. By containing MDI, the film-forming property of the resin primer improves, and the flexibility of the resin layer comprising this primer improves. The aliphatic diisocyanate may for example be hexamethylene diisocyanate, 2,2,4-trimethylhexamethylene diisocyanate or isophorone diisocyanate.

As diisocyanate, an aromatic diisocyanate and aliphatic diisocyanate may be used separately or may be used together, but preferably, at least an aromatic diisocyanate is included and more preferably both types are used together.

When using both types together, the blending ratio thereof is preferably such that the aliphatic diisocyanate content is about 5-10 moles % relative to the aromatic diisocyanate. By using the aromatic diisocyanate and aliphatic diisocyanate together in this way, the heat-resistance of the polyamideimide and therefore the resin primer can be further improved.

The reaction of diimide-dicarboxylic acid and these diisocyanates is preferably performed by adding the diisocyanate to the solution containing the diimide-dicarboxylic acid after the aforesaid reaction, and the reaction temperature is preferably 130-200° C.

This reaction is more preferably performed in the presence of a basic catalyst, and in this case, the reaction temperature is 70-180° C. but preferably 120-150° C. In this way, side reactions such as reactions between diisocyanates can be suppressed, and a polyamideimide of higher molecular weight can be obtained.

The basic catalyst may for example be a trialkylamine such as trimethylamine, triethylamine, tripropylamine, tri(2-ethylhexyl)amine or trioctylamine. Among these, triethylamine can promote the reaction, and since its removal after the reaction is also easy, it is preferred.

The polyamideimide thus obtained has a repeating unit in the molecule expressed by the following general formula (12a), and is preferably used together with a repeating unit expressed by the following general formula (12b). In the following formulae, $R^{10}$, $R^{11}$, $R^{81}$, $R^{82}$, $R^{83}$ and m are identical to the above:

The second resin also, as in the case of the aforesaid first resin, in addition to polyamideimide, preferably further contains a reactive compound having a functional group which reacts with the amide groups in this polyamideimide. This reactive compound may be that used for the first resin described above, and its blending proportion is preferably 5-25 wt % relative to the total weight of resin primer.

If the blending proportion of the reactive compound is less than 5 wt %, the film-forming property of the resin primer containing the second resin may decrease. On the other hand, if it exceeds 25 wt %, the resin layer comprising the resin primer becomes weak, and there is also a tendency for adhesion to the conductor foil to decrease. It is more preferred that when the reactive compound is contained in this way, a curing agent and/or hardening accelerator identical to those of the aforesaid first resin are further contained therein.

In the second resin, a filling agent, coupling agent or flame retarder may be further contained as other ingredients.

(Other Resins)

The resin contained in the resin primer of the embodiment, in addition to the aforesaid first or second resin, may also be another resin as shown below. Firstly, the other resin may be a carbamate obtained by reacting a resin having a hydroxyl group in the structure with an isocyanate. Here, the isocyanate may be phenyl isocyanate, ethyl isocyanate, propyl isocyanate, butyl isocyanate, fluorophenyl isocyanate, chlorophenyl isocyanate or bromophenyl isocyanate, but it is not limited thereto.

The other resin may also be an aromatic carboxylic acid ester obtained by reacting a resin having a hydroxyl group in the structure with an aromatic carboxylic acid or a derivative thereof. This reaction may be for example a direct esterification between an aromatic carboxylic acid and a hydroxyl group with a mineral acid as catalyst.

The aromatic carboxylic acid derivative may be for example benzoic acid chloride, benzoic acid bromide, methyl benzoic acid chloride, methyl benzoic acid bromide, ethyl

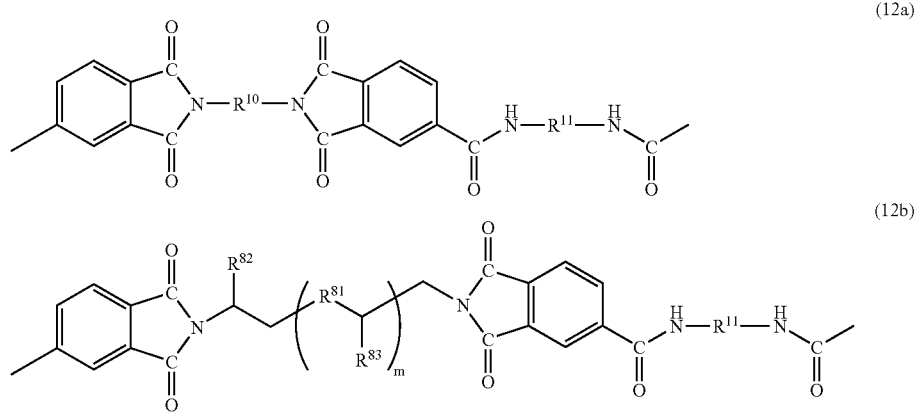

(12a)

(12b)

The polyamideimide in the second resin obtained in this way preferably has a weight average molecular weight of 20,000-300,000, more preferably 30,000-200,000 and still more preferably 40,000-150,000.

The weight average molecular weight here is the value obtained by performing a measurement with gel permeation chromatography, and converting the measured value by a calibration curve drawn using standard polystyrene.

benzoic acid chloride, ethyl benzoic acid bromide, propyl benzoic acid chloride, propyl benzoic acid bromide, butyl benzoic acid chloride or butyl benzoic acid bromide, but it is not limited thereto.

In the synthesis of the aromatic carboxylic acid ester, the aromatic dicarboxylic acid ester bond, in addition to the above, may be formed by via tosylation (p-toluene sulfonization) of the hydroxyl group. For example, the hydroxyl group and tosyl chloride (p-toluene sulfonyl chloride) can be reacted to introduce a tosyl group (p-toluenesulfonic acid ion) into the structure. This tosyl group is an excellent leaving group, and can easily replace carboxylate ion.

(Other Ingredients)

Thus, although the resin primer relating to the embodiment contains the aforesaid various kinds of resin, in addition to these resins, it may further contain other ingredients. As examples of these other ingredients, firstly, a rubber ingredient may be mentioned. If the resin primer contains such a rubber ingredient, the adhesion of the resin layer comprising the resin primer to the metal foil is further improved.

Here, "rubber ingredient" means a polymer having rubber-like elasticity. The rubber ingredient may be for example acrylic rubber, natural rubber, isoprene rubber, butadiene rubber, chloroprene rubber, nitrile rubber, silicone rubber or urethane rubber, but it is not limited thereto. It is more preferred that when this rubber is contained to the extent of more than 40 mass %.

In addition to the rubber ingredient, the other ingredients may contain an engineering plastic such as nylon, polycarbonate or polyarylate. A resin to which these ingredients are added has still higher breaking energy, and the resin layer obtained therefrom has even stronger adhesion to the metal foil.

[Conductor Foil with Resin]

Figure 3:
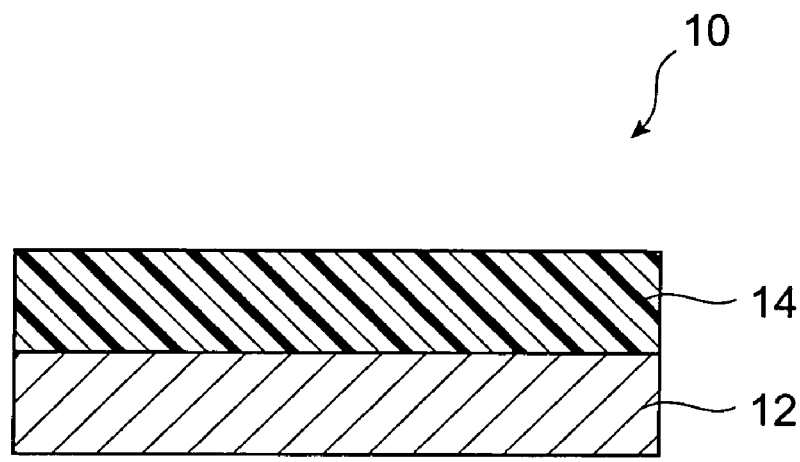
FIG. 3 is a diagram schematically showing the cross-sectional structure of a conductor foil with resin relating to an embodiment of the invention.

Next, the conductor foil with resin according to a suitable embodiment will be described. The conductor foil with resin is obtained by coating the aforesaid resin primer on a conductor foil. FIG. 3 is a diagram schematically showing the cross-sectional structure of a conductor foil with resin according to the embodiment. A conductor foil with resin 10 which is shown comprises a conductor foil 12 and a resin layer 14 comprising the resin primer of the embodiment described above which is formed thereupon.

Here, in the conductor foil 12, the 10 point average roughness (Rz) of at least the surface on which the resin primer is applied, is preferably 3 µm or less, but more preferably 2 µm or less.

Rz of the surface of the conductor foil 12 is identical to the "10 point average roughness" of the resin film surface. It is deduced using the measurement method according to JIS B0601-1994, and can be measured for example using a commercial needle contact surface roughness gauge.

Although magnetic force lines occur in the vicinity of the current flowing in a conductor, since interference of the magnetic force lines is larger the nearer to the central part of the conductor it is, the current is concentrated at the circumference and corners. This is called the skin effect, and this tendency becomes stronger, the higher the frequency is. On the other hand, the conductor circuit obtained from the conductor foil 12 described above is quite smooth if Rz is 3 µm or less, and it is thought that this suppresses the increase in resistance due to the aforesaid skin effect which is advantageous for transmission of high frequency signals.

The conductor foil 12 is not particularly limited if it has the above properties, but from the viewpoint of good conductivity, it is preferably a metal foil and more preferably a copper foil. The copper foil may be an electrolytic copper foil or rolled copper foil, and preferably has no surface unevenness due to roughening treatment or the like.

The glossy surface of an ordinary electrolytic copper foil satisfies these conditions, and when using such a copper foil, the glossy surface can be used as the resin primer coating surface as it is. The copper foil which satisfies such conditions may be for example F0-WS (Rz=1.2), F1-WS, F2-WS (Rz=3.0), GTS, GTS-MP, GTS-FLP, GY, GY-MP, TSTO, DT-GL, DT-GLD (all Furukawa Circuit Foil), 3EC-VLP (Mitsui Mining & Smelting, Rz=3.0), or SLP, YGP (Nippon Denkai). The glossy surface of these commercial copper foils has an Rz of 1.5-2.0 µm, and a copper foil of particularly low surface roughness, F0-WS (Furukawa circuit foil, Rz=1.2 µm), is commercially available. The thickness of these copper foils is preferably about 9-18 µm.

A peelable copper foil, wherein the surface of a carrier copper foil is given a mold release treatment and an ultrathin copper foil is laminated thereupon, can also be used. In this case, the thickness of the copper foil is 3 µm or 5 µm. As examples of this copper foil, MTS (Mitsui Mining & Smelting), NAP (Nippon Denkai) and FCF (Furukawa Circuit Foil) are commercially available.

The copper foil may have a suitable thickness as required. Commercial copper foil has a thickness in a range of about 10-150 µm, and for circuit board use, copper foil having a thickness of 18 µm or 35 µm is generally used. However, from the viewpoint of forming a finer circuit pattern, in the invention, a relatively thin film copper foil having a thickness of 12 µm or 9 µm is more preferred.

As examples of metal foils other than copper foil, composite foils may be used, e.g., an aluminum foil of thickness 5-200 µm, a composite foil having a three-layer construction comprising a copper foil layer of thickness 0.5-15 µm, a copper foil layer of thickness 10-300 µm and an interlayer of nickel, nickel-phosphorus, nickel-tin alloy, nickel-iron alloy, lead or lead-tin alloy provided therebetween, or a composite foil having a two-layer construction comprising aluminium and copper foil. Also for these metal foils, it is preferred that the surface roughness satisfies the aforesaid conditions.

The resin primer may be coated on the conductor foil 12 by a known method, for example by a comma coater, dip coater, kiss coater or natural flow casting. The coating is preferably performed as a varnish prepared by dissolving or dispersing the resin primer in an organic solvent, the concentration of resin primer being 0.1-10%, but preferably 2-6%.

The organic solvent used for the varnish may be dimethylacetamide, dimethylformamide, dimethylsulfoxide, N-methyl-2-pyrrolidone, γ-butyrolactone, sulfolane or cyclohexanone. When the resin primer is applied as a varnish, after coating, the organic solvent is preferably vaporized by heating or the like to an extent that curing of the resin primer does not occur.

(Conductor-Clad Laminated Sheet)

Figure 4:
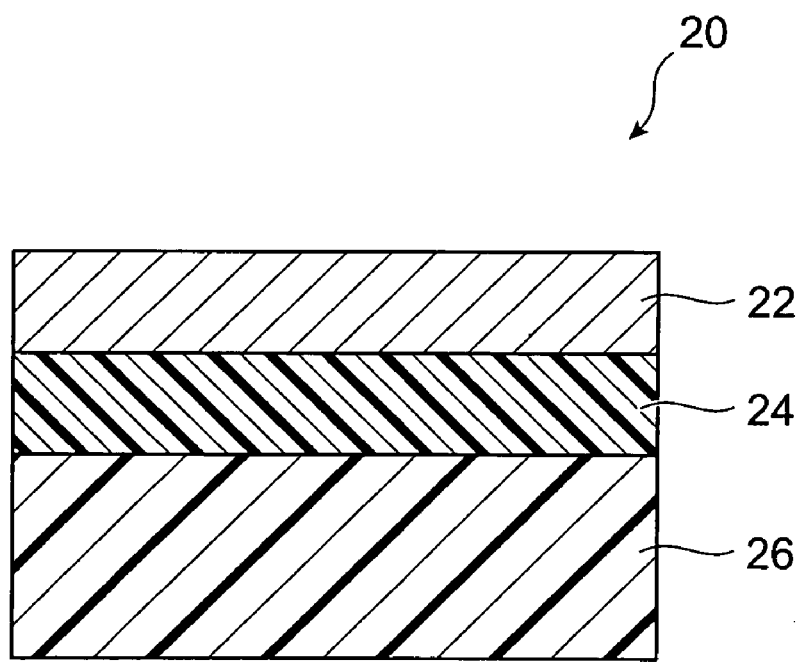
FIG. 4 is a diagram showing the cross-sectional structure of a conductor-clad laminated sheet (laminate) relating to the embodiment.

FIG. 4 is a diagram schematically showing the cross-sectional structure of a conductor-clad laminated sheet (laminate) according to the embodiment. A conductor-clad laminated sheet 20 has a structure wherein an insulator layer 26, adhesive layer 24 and conductor foil 22 are laminated in this order.

The insulator layer 26 is not particularly limited provided that it is one of those usually used for a conductor-clad laminated sheet. Specifically, it may comprise a prepreg of a curing resin in the B stage state which is not provided with reinforcing fibers, or a prepreg of a curing resin in the B stage state which is provided with reinforcing fibers. Among these, it preferably comprises a prepreg of curing resin in the B stage state provided with reinforcing fibers.

The former prepreg of curing resin in the B stage state which is not provided with reinforcing fibers can be obtained by forming a curing resin in a film shape, and putting it into a semi-cured state (B stage). The latter prepreg of curing resin in the B stage state provided with reinforcing fibers can be obtained by impregnating a curing resin with reinforcing fibers, and putting the impregnated resin into a semi-cured state (B stage).

The curing resin may be identical to that of or different from the resin forming the resin primer. Specifically, the curing resin is preferably an epoxy resin, polyimide resin or phenol resin.

The reinforcing fiber may be a glass fiber of E glass, D glass, S glass or Q glass, an organic fiber of polyimide, polyester or tetrafluoroethylene, or a mixed fiber thereof. These fibers can be used as reinforcing fibers having the specific shape of, for example, a textile fabric, nonwoven fabric, roving, chopped strand mat or surfacing mat.

The blending ratio of curing resin and reinforcing fibers in the prepreg provided with reinforcing fibers, in terms of mass ratio, is preferably curing resin/reinforcing fibers=20/80-80/20, but more preferably 40/60-60/40.

A commercial prepreg can also be used as the prepreg. For example, a prepreg (GEA-67, GEA-679, GEA-679F; Hitachi Chemical Industries Co., Ltd.) of thermosetting resin having an epoxy resin as main ingredient impregnated with glass cloth, which is a glass fiber fabric, a high frequency-compatible prepreg (GEA-LX-67; Hitachi Chemical Industries Co., Ltd.) impregnated with a resin of low permittivity, and a prepreg (GEA-I-671; Hitachi Chemical Industries Co., Ltd.) of polyimide resin blended with a thermosetting ingredient impregnated with glass cloth, may be mentioned. The insulator layer 26 may have only one layer of these prepregs, or may have plural sheets thereof superimposed.

The adhesive layer 24 is a layer comprising the aforesaid resin primer of the invention. Specifically, it is preferably a layer formed by drying the aforesaid resin primer. The conductor foil 22 is preferably that used in the aforesaid conductor foil with resin 10, and more preferably, Rz of the adhesion surface with the adhesive layer 24 is 3 µm or less.

The conductor-clad laminated sheet 20 may be manufactured as shown below. A single layer of the aforesaid prepreg is taken or plural layers are superimposed, and a laminate is obtained by laminating the aforesaid conductor foil with resin 10 on this so that it is in contact with the resin layer 14. In this case, from the viewpoint of the thinness and shortening of the drying time of the printed circuit board and therefore devices comprising this printed circuit board, the thickness of the resin layer 14 in the conductor foil with resin 10 based on the projecting part of the conductor foil surface is preferably 5 µm or less, more preferably 4 µm or less and most preferably 3 µm or less.

This laminate is then heated and/or pressurized under predetermined conditions to obtain the conductor-clad laminated sheet 20. Due to this, the resin in the prepreg and resin layer 14 in the conductor foil with resin 10 harden, and respectively form the insulator layer 26 and adhesive layer 24. The heating is preferably performed at a temperature of 160-250° C., and the pressurization is preferably performed at a pressure of 0.1-8.0 MPa, or more preferably in a vacuum. Heating and pressurization are performed simultaneously using a vacuum press or the like. In this case, the conductor-clad laminated sheet 20 wherein there is excellent adhesion between the conductor foil 22 and insulator layer 26 (prepreg) can be manufactured by performing this treatment for 10 minutes or more, preferably 30 minutes or more, but more preferably 60 minutes or more.

The conductor-clad laminated sheet of the invention may be provided with a conductor foil on both sides of the insulating layer via an adhesive layer. This conductor-clad laminated sheet may be manufactured by laminating the conductor foil with resin described above on both sides of the prepreg or its laminate.

In the conductor-clad laminated sheet having such a construction, the conductor foil is stuck to the cured prepreg (insulator layer) via an adhesive layer of the cured resin primer of the invention, and the cured insulating layer and adhesive layer are integrated by hardening. The conductor foil in the conductor-clad laminated sheet is thereby firmly stuck to the insulating layer.

Therefore, even when a printed circuit board having a fine circuit pattern is formed using this conductor-clad laminated sheet, the circuit pattern formed from the conductor foil, which is firmly stuck, hardly ever peels off from the base material. Also, since the cured adhesive layer is formed from the resin primer containing a resin described above, it also has a high heat resistance. Hence, even when the conductor-clad laminated sheet is exposed to high temperature during metal plating or the like, this adhesive layer hardly ever swells up.

EXAMPLES

Hereafter, some examples of the invention will be described in detail, but the invention is not limited to these examples.

Preparation of Resin Primer

Examples 1-3

The starting materials shown in TABLE 1 were blended, and dissolved by stirring to obtain the resin primers of Examples 1-3. In TABLE 1, as bisphenol A epoxy resin, DER-331L (epoxy equivalent=184, Dow Chemical Co., Ltd., trade name) was used; as novolac phenol resin, HP-850N (hydroxyl group equivalent=106, Hitachi Chemical Industries Co., Ltd., trade name) was used; and as acrylic rubber, W-248DR (Shin-Nakamura Chemical Industries Co., Ltd., trade name) was used.

TABLE 1

| Resin (g) | Example 1 | Example 2 | Example 3 |
|---|---|---|---|
| Bisphenol A epoxy resin | 5 | 5 | 5 |
| Novolak phenol resin | 1 | 2 | 3 |
| Acrylic rubber | 0.6 | 1.2 | 1.7 |
| DBU (g) | 0.01 | 0.02 | 0.03 |
| MEK (g) | 9.9 | 12.2 | 14.6 |

Example 4

100 g of phenoxy resin (YP-50, hydroxyl group equivalent=284, Toto Kasei Inc., trade name) and 330 g of cyclohexanone were introduced into a 1 L separable flask fitted with a reflux condenser, thermometer and stirrer, and the mixture heated with stirring to dissolve the resin. Subsequently, 41.9 g phenyl isocyanate and 0.3 g triethylamine were added, and reacted at 130° C. for 3 hours. Next, the product was reprecipitated in ethanol, and dried to give a phenoxy resin to which carbamate had been added. This resin was then dissolved in dimethylformamide (DMF) to give a concentration of 30 mass %, and the resin primer of Example 4 was thus obtained.

Example 5

A resin primer of Example 5 was obtained by dissolving the commercial adhesive sheet AS-3000E (Hitachi Chemical Industries Co., Ltd.) in methyl ethyl ketone (MEK) so that the concentration was 30 mass %.

Comparative Examples 1-3

A resin primer was obtained by blending the starting materials shown in TABLE 2, and dissolving them by stirring. In TABLE 2, the same bisphenol A epoxy resin, novolac phenol resin and acrylic rubber was used as in Examples 1-3.

TABLE 2

| Resin (g) | Example 1 | Example 2 | Example 3 |
|---|---|---|---|
| Bisphenol A epoxy resin | 5 | 5 | 5 |
| Novolak phenol resin | 5 | 7.5 | 10 |
| Acrylic rubber | 2.9 | 4.3 | 5.8 |
| DBU (g) | 0.05 | 0.075 | 0.1 |
| MEK (g) | 19.4 | 25.2 | 31.6 |

Comparative Example 4

A polysulfone resin (Kordell P-1700, Amoco Corporation, trade name) was dissolved in DMF to give a concentration of 30 mass and a resin primer was thus obtained.

Comparative Example 5

Polyether sulfone resin (5003P, Sumitomo Chemical Co., Ltd., trade name) was dissolved in DMF to give a concentration of 30 mass %, and a resin primer was thus obtained.

Measurement of Breaking Energy:

The breaking energy was measured using an autograph AG-100C (Shimadzu Corporation, trade name).

For the resin primers obtained in Examples 1-3 and Comparative Examples 1-3, firstly, the resin primer was coated on the glossy surface (Rz=2 μm) of a copper foil (GTS-18, Furukawa Circuit Foils, trade name) so that the film thickness after drying was 50 μm, and dried in a hot air recirculation dryer heated to 120° C. for 10 minutes. Next, on the adhesive layer provided on the copper foil, on the surface not yet stuck to copper foil, another copper foil was laminated so that the other copper foil was facing the glossy surface, and the whole was compressed under the conditions of 170° C., 3.0 MPa for 1 hour from the side not in contact with the adhesive layer of the copper foil. Next, the copper foil on both sides was removed by etching. In this way, a specimen (resin film) for breaking energy measurement in Examples 1-3 and Comparative Examples 1-3 was obtained.

For the resin primers of Example 4 and Comparative Examples 4 and 5, firstly, the resin primer was applied to a carrier film so that the film thickness after drying was 50 μm, and a test piece for breaking energy measurement (resin film) was obtained by drying in a hot air recirculation dryer heated to 120° C. for 10 minutes.

For the primer of Example 5, a test piece for breaking energy measurement (resin film) was obtained by curing the adhesion sheet AS-3000E.

Next, each of the aforesaid test pieces was gripped between two grips at a distance of 60 mm apart in the length direction. The two grips were then moved away from each other at a speed of 5 mm/minute in the length direction of this film, so as to pull the film. At this time, the deformation and the stress value were measured by the aforesaid device. When the film broke, the pulling was terminated. The integral value of tensile stress until the test piece broke in the obtained stress-strain curve, was calculated as the breaking energy. TABLE 3 shows the results.

TABLE 3

| | Breaking energy (J) | Formamide contact angle (degree) | Copper foil peel strength (kN/m) | Peel strength (kN/m) of copper foil/ resin interface |
|---|---|---|---|---|
| Example 1 | 0.81 | 65 | 2.1 | 0.3 |
| Example 2 | 0.71 | 64 | 1.9 | 0.3 |
| Example 3 | 0.32 | 64 | 1.1 | 0.4 |
| Example 4 | 0.058 | 55 | 0.4 | 0.9 |
| Example 5 | 0.18 | 58 | 0.9 | 0.9 |
| Comparative example 1 | 0.058 | 64 | 0.5 | 0.3 |
| Comparative example 2 | 0.012 | 63 | 0.4 | 0.3 |
| Comparative example 3 | 0.0044 | 63 | 0.4 | 0.3 |
| Comparative example 4 | 0.054 | 72 | 0.01 | 0.2 |
| Comparative example 5 | 0.081 | 69 | 0.05 | 0.3 |
| Comparative example 6 | — | — | 0.1 | — |

Measurement of Formamide Contact Angle:

A formamide contact angle measurement was performed as follows using the contact angle measuring device CA-DT by Kyowa Interface Science Co. For the resin primers of Examples 1-3 and Comparative Examples 1-3, the resin primer was coated on the glossy surface (Rz=2 μm) of a copper foil (GTS-18, Furukawa Circuit Foil Co., Ltd., trade name), and after drying in a hot air recirculation dryer heated to 120° C. for 10 minutes, the formamide contact angle with respect to the surface of the resin film obtained by curing in a 170° C. environment for 1 hour was measured.

For the primers of Example 4 and Comparative Examples 4, 5, the primer was applied to a carrier film, and the formamide contact angle on the surface of the resin film obtained by drying in a hot air recirculation dryer heated to 120° C. for 10 minutes was measured.

For the primer of Example 5, the formamide contact angle on the surface of the resin film obtained by curing the adhesion sheet AS-3000E, was measured. TABLE 3 shows the results.

Measurement of Copper Foil Peel Strength:

In general, in the circuit board field, a peel test which measures the copper foil peel strength is used to evaluate the adhesion between a resin and a metal foil. To evaluate the adhesion between the resin obtained from the primer in the conductor-clad laminated sheet and the conductor foil of the invention, the copper foil peel strength was measured as follows.

First, the primer of Examples 1-4 and Comparative Examples 1-5 obtained as described above, was coated on the glossy surface (Rz=2 μm) of a copper foil (GTS-18) so that the film thickness after drying was 5 μm, and dried in a hot air recirculation dryer heated to 120° C. for 10 minutes so as to prepare a copper foil with resin. Next, 5 low permittivity prepregs (GEA-LX-67, Hitachi Chemical Industries Co., Ltd., trade name) were laminated, the aforesaid copper foil with resin was superimposed on both sides with the resin (adhesive layer) and prepregs facing each other, and compressed under the conditions of 230° C., 3.0 MPa for 90 minutes so as to obtain a double-sided copper clad laminated sheet.

For the primer of Example 5, first, AS-3000E was dissolved in methyl ethyl ketone (MEK) to give a concentration of 30 wt %, the obtained resin solution was coated on a carrier film to give a film thickness of 50 μm after drying, and the assembly was dried in a hot air recirculation dryer heated to 120° C. for 10 minutes to manufacture a copper foil with resin. Next, 5 low permittivity prepregs (GEA-LX-67, Hitachi Chemical Industries Co., Ltd., trade name) were laminated, the aforesaid copper foil with resin was superimposed on both sides with the resin (adhesive layer) and prepregs facing each other, and compressed under the conditions of 230° C., 3.0 MPa for 90 minutes so as to obtain a double-sided copper clad laminated sheet.

Further, as Comparative Examples 6, 5 low permittivity prepregs (GEA-LX-67, Hitachi Chemical Industries Co., Ltd., trade name) were laminated, the copper foil (GTS-18) was superimposed on both sides with its glossy surface R=2 μm) and prepreg facing each other, and compressed under the conditions of 230° C., 3.0 MPa for 90 minutes so as to obtain a double-sided copper clad laminated sheet.

The copper foil peel strength was measured by peeling off copper foil of width 1 cm on each double-sided copper clad laminated sheet at a speed of 5 cm/minute. TABLE 3 shows the results.

Peel Strength Measurement of Copper Foil/Resin Interface:

Since the adhesion area decreases, the smoother the adhesion interface between the resin obtained from the primer and conductor foil is, not only the physical properties of the resin forming the primer but also the chemical interactions between the resin and conductor foil, become more important. To remove the effect of resin physical properties and evaluate the adhesion due to chemical interactions, the peel strength at the interface between the conductor foil and the adhesive layer of resin was measured using a shaving method which measures adhesive force by shaving the resin off the metal foil.

First, the same copper foil with resin of Examples 1-5 and Comparative Examples 1-5 used to measure the copper foil peel strength were fixed to a supporting substrate so that the adhesive layer of resin was facing upwards, and this was used as a measurement sample. The peel strength of the copper foil/resin interface of this copper foil with resin was measured using a Daipla-Wintes Co., Ltd. SAICAS CN-100.

Specifically, the peel strength of the copper foil/resin interface was measured by cutting a notch in the adhesive layer with a blade of width 2 mm at a horizontal velocity of 10 μm/second and a vertical velocity of 0.5 μm/second, and arranging that the cutting direction of the blade was only horizontal when the blade reached the interface of the adhesive layer and copper foil. TABLE 3 shows the results.

For the resins of Examples 1-3, 5 having a breaking energy of 0.15 J or more, even if a smooth copper foil having a 10 point average roughness of 2 μm was used, the peel strength was 0.9 kN/m or more. For the resins of Examples 4, 5 whereof the formamide contact angle was 60° or less, even if a smooth copper foil having a 10 point average roughness of 2 μm was used, the peel strength at the interface between the copper foil and resin was 0.9 kN/m.

On the other hand, for the resins of Comparative Examples 1-5 having a breaking energy of less than 0.15 J, for which the formamide contact angle was more than 60°, the copper foil peel strength was 0.5 kN/m or less and the peel strength of the copper foil/resin interface was 0.3 kN/m or less, which are both low values. For Comparative Example 6 wherein the copper foil and prepreg were directly laminated, the copper foil peel strength was 0.1 kN/m, which is a low value compared with Examples 1-5.

Synthesis of Polyamideimide

Synthesis Example 1

57.5 g (0.14 mol) of 2,2-bis[4-(4-aminophenoxy)phenyl] propane (BAPP) as aromatic diamine, 50.5 g (0.06 mol) of the reactive silicone oil KF8010 (Shin-Etsu Chemical Industries Co., Ltd., amine equivalent 421) as siloxane diamine, 80.7 g (0.42 mol) of anhydrous trimellitic acid (TMA) and 580 g of N-methyl-2-pyrrolidone (NMP) as aprotic polar solvent were introduced into a 1 L separable flask fitted with a 25 ml fixed amount water receiver with cock directly connected to a reflux condenser, thermometer and stirrer, and the mixture stirred at 80° C. for 30 minutes.

After stirring was complete, 100 mL of toluene was added as an aromatic hydrocarbon which can form an azeotropic mixture with water, the temperature increased to 160° C. and the mixture refluxed for 2 hours. When it was found that about 7.2 mL or more of water had accumulated in the fixed amount water receiver and no more water was observed to distil off, the temperature was increased to 190° C. while removing the water in the fixed amount water receiver, and toluene was thus removed.

After returning the solution in the flask to room temperature, 60.1 g (0.24 mol) of 4,4'-diphenylmethanediisocyanate (MDI) was added as aromatic isocyanate, the temperature increased to 190° C. and the mixture reacted for 2 hours. After the reaction, the solution was cooled to room temperature, and a solution of polyamideimide in NMP having an amide group content of 8.05 wt % and a silicon atom content of 8.68 wt % was thereby obtained.

Synthesis Example 2

41.1 g (0.10 mol) of BAPP as aromatic diamine, 84.2 g (0.10 mol) of the reactive silicone oil KF8010 as siloxane diamine, 80.7 g (0.42 mol) of TMA and 494 g of NMP as aprotic polar solvent were introduced into a 1 L separable flask fitted with a 25 ml fixed amount water receiver with cock directly connected to a reflux condenser, thermometer and stirrer, and the mixture stirred at 80° C. for 30 minutes.

After stirring was complete, 100 mL of toluene was added as an aromatic hydrocarbon which can form an azeotropic mixture with water, the temperature increased to 160° C. and the mixture refluxed for 2 hours. When it was found that about 7.2 mL or more of water had accumulated in the fixed amount water receiver and no more water was observed to distil off, the temperature was increased to 190° C. while removing the water in the fixed amount water receiver, and toluene was thus removed.

After returning the solution in the flask to room temperature, 60.1 g (0.24 mol) of MDI was added as aromatic isocyanate, the temperature increased to 190° C. and the mixture reacted for 2 hours. After the reaction, the solution was cooled to room temperature, and a solution of polyamideimide in NMP having an amide group content of 7.38 wt % and a silicon atom content of 13.26 wt % was thereby obtained.

Synthesis Example 3

41.05 g (0.10 mol) of BAPP as aromatic diamine, 135.8 g (0.10 mol) of the dimethylphenyl reactive silicone oil X-22-9409 (Shin-Etsu Chemical Industries Co., Ltd., amine equivalent 679) as siloxane diamine, 80.7 g (0.42 mol) of TMA and 590 g of NMP as aprotic polar solvent were introduced into a 1 L separable flask fitted with a 25 ml fixed amount water receiver with cock directly connected to a reflux condenser, thermometer and stirrer, and the mixture stirred at 80° C. for 30 minutes.

After stirring was complete, 100 mL of toluene was added as an aromatic hydrocarbon which can form an azeotropic mixture with water, the temperature increased to 160° C. and the mixture refluxed for 2 hours. When it was found that about 7.2 mL or more of water had accumulated in the fixed amount water receiver and no more water was observed to distil off, the temperature was increased to 190° C. while removing the water in the fixed amount water receiver, and toluene was thus removed.

After returning the solution in the flask to room temperature, 60.1 g (0.24 mol) of MDI was added as aromatic isocyanate, the temperature increased to 190° C. and the mixture reacted for 2 hours. After the reaction, the solution was cooled to room temperature, and a solution of polyamideimide in NMP having an amide group content is 6.12 wt % and a silicon atom content is 10.99 wt % was thereby obtained.

Comparative Synthesis Example 1

161.0 g (0.10 mol) of the dimethylphenyl reactive silicone oil X-22-161A (Shin-Etsu Chemical Industries Co., Ltd., amine equivalent 805) as siloxane diamine, 40.34 g (0.21 mol) of TMA and 430 g of NMP as aprotic polar solvent were introduced into a 1 L separable flask fitted with a 25 ml fixed amount water receiver with cock directly connected to a reflux condenser, thermometer and stirrer, and the mixture stirred at 80° C. for 30 minutes.

After stirring was complete, 100 mL of toluene was added as an aromatic hydrocarbon which can form an azeotropic mixture with water, the temperature increased to 160° C. and the mixture refluxed for 2 hours. When it was found that about 3.6 mL or more of water had accumulated in the fixed amount water receiver and no more water was observed to distil off, the temperature was increased to 190° C. while removing the water in the fixed amount water receiver, and toluene was thus removed.

After returning the solution in the flask to room temperature, 30.1 g (0.12 mol) of MDI was added as aromatic isocyanate, 1.0 g of triethylamine introduced, the temperature increased to 110° C. and the mixture reacted for 4 hours. After the reaction, the solution was cooled to room temperature, and a solution of polyamideimide in NMP having an amide group content of 4.07 wt % and a silicon atom content of 27.96 wt % was thereby obtained.

Preparation of Resin Primer

Example 6

63.3 g (solids content 30 wt %) of the solution of polyamideimide in NMP obtained in Synthesis Example 1, 2.0 g of DER331L (Dow Chemical Co., bisphenol A epoxy resin) which is an epoxy resin as the reactive compound (dimethylacetamide solution having a solids content of 50 wt %) and 0.02 g of 2-ethyl-4-methylimidazole were blended, and stirred for about 1 hour until the composition was homogeneous. After adding dimethylacetamide to adjust the solids content to 5 wt %, the solution was left at room temperature for 2 hours for degassing, and a resin primer having an amide group content of 7.65 wt % and a silicon atom content of 8.25 wt % was thereby obtained.

Example 7

63.3 g (solids content 30 wt %) of the solution of polyamideimide in NMP obtained in Synthesis Example 2, 2.0 g of DER331L (Dow Chemical Co., bisphenol A epoxy resin) which is an epoxy resin as the reactive compound (dimethylacetamide solution having a solids content of 50 wt %) and 0.02 g of 2-ethyl-4-methylimidazole were blended, and stirred for about 1 hour until the composition was homogeneous. After adding dimethylacetamide to adjust the solids content to 5 wt %, the solution was left at room temperature for 2 hours for degassing, and a resin primer having an amide group content of 7.38 wt % and a silicon atom content of 12.56 wt % was thereby obtained.

Example 8

60.0 g (solids content 30 wt %) of the solution of polyamideimide in NMP obtained in Synthesis Example 3, 4.0 g of YDCN500-10 (Toto Kasei, bisphenol A epoxy resin) which is an epoxy resin as the reactive compound and 0.04 g of 2-ethyl-4-methylimidazole were blended, and stirred for about 1 hour until the composition was homogeneous. After adding dimethylacetamide to adjust the solids content to 5 wt %, the solution was left at room temperature for 2 hours for degassing, and a resin primer having an amide group content of 5.81 wt % and a silicon atom content of 10.44 wt % was thereby obtained.

Example 9

63.3 g (solids content 30 wt %) of the solution of polyamideimide in NMP obtained in Synthesis Example 1, 2.0 g of NC3000H (Nippon Kayaku, Zailock epoxy resin) which is an epoxy resin as the reactive compound (dimethylacetamide solution having a solids content of 50 wt %), and 0.02 g of 2-ethyl-4-methylimidazole were blended, and stirred for about 1 hour until the composition was homogeneous. After adding dimethylacetamide to adjust the solids content to 5 wt %, the solution was left at room temperature for 2 hours for degassing, and a resin primer having an amide group content of 7.25 wt % and a silicon atom content of 7.81 wt % was thereby obtained.

Example 10

To 63.3 g (solid content 30 wt %) of the solution of polyamideimide in NMP obtained in Synthesis Example 2, dimethylacetamide was added to adjust the solids content to 5 wt %, the solution was left at room temperature for 2 hours for degassing, and a resin primer having an amide group content of 7.38 wt % and a silicon atom content of 13.26 wt % was thereby obtained.

Comparative Example 7

26.7 g (solids content 30 wt %) of the solution of polyamideimide in NMP obtained in Synthesis Example 2, 24.0 g of DER331L which is an epoxy resin as the reactive compound (dimethylacetamide solution having a solids content of 50 wt %) and 0.24 g of 2-ethyl-4-methylimidazole were blended, and stirred for about 1 hour until the composition was homogeneous. After adding dimethylacetamide to adjust the solids content to 5 wt %, the solution was left at room temperature for 2 hours for degassing, and a resin primer having an amide group content of 2.95 wt % and a silicon atom content of 5.30 wt % was thereby obtained.

Comparative Example 8

60.0 g (solids content 30 wt %) of the solution of polyamideimide in NMP obtained in Comparative Synthesis Example 1, 4.0 g of DER331L which is an epoxy resin as the reactive compound (dimethylacetamide solution having a solids content of 50 wt %) and 0.04 g of 2-ethyl-4-methylimidazole were blended, and stirred for about 1 hour until the composition was homogeneous. After adding dimethylacetamide to adjust the solids content to 5 wt %, the solution was left at room temperature for 2 hours for degassing, and a resin primer having an amide group content of 3.66 wt % and a silicon atom content of 25.16 wt % was thereby obtained.

Copper Foil Peel Strength Measurement:

The resin primer of Examples 6-10 and Comparative Examples 7-8 was natural flow cast on the glossy surface (Rz=1.5 μm; Rz is surface roughness based on JIS B0601-1994) of an electrolytic copper foil (thickness 12 μm), and dried at 130° C. for 20 minutes to obtain a copper foil with resin. The thickness of the resin layer after drying was 1-2 μm.

Next, on both sides of a base material (hereafter, "low permittivity base material") formed by laminating a predetermined number of low permittivity prepregs (Hitachi Chemical Industries Co., Ltd., GEA-LX-67) or a base material (hereafter, "imide base material") formed by laminating a predetermined number of imide prepregs (Hitachi Chemical Industries Co., Ltd., GEA-I-671), the aforesaid copper foils with resin were superimposed with the resins (adhesive layers) in contact, and the assembly was compression bonded under conditions of 230° C., 3.0 Mpa for 90 minutes so as to manufacture a double-sided copper-clad laminated sheet.

As Comparative Example 9, an electrolytic copper foil without resin (adhesive layer) was compression bonded to a laminate comprising a predetermined number of the aforesaid prepregs so as to manufacture a double-sided copper-clad laminated sheet.

The copper foil peel strength (kN/m) was measured by measuring the peel strength (based on 90° peel strength, JIS C6481) when the copper foils in the obtained double-sided copper-clad laminated sheets were respectively peeled off in a 90° direction. TABLE 4 shows the obtained results.

Solder Heat Resistance Evaluation:

The aforesaid double-sided copper-clad laminated sheets were cut to 20 mm×20 mm to manufacture samples for solder heat resistance tests. The solder heat resistance property was evaluated by respectively immersing these samples in a 260° C. solder bath, and checking, for swelling at the adhesion interface of copper foil and base material, or peeling of metal foil from the base material. Sheets for which swelling and peeling were not observed for 180 seconds or more after immersion in the solder bath were marked 0 and deemed to have excellent solder heat resistance, whereas sheets for which swelling or peeling was observed within 180 seconds were marked X and deemed to have inferior solder heat-resisting property. TABLE 4 shows the obtained results.

Figure 5:
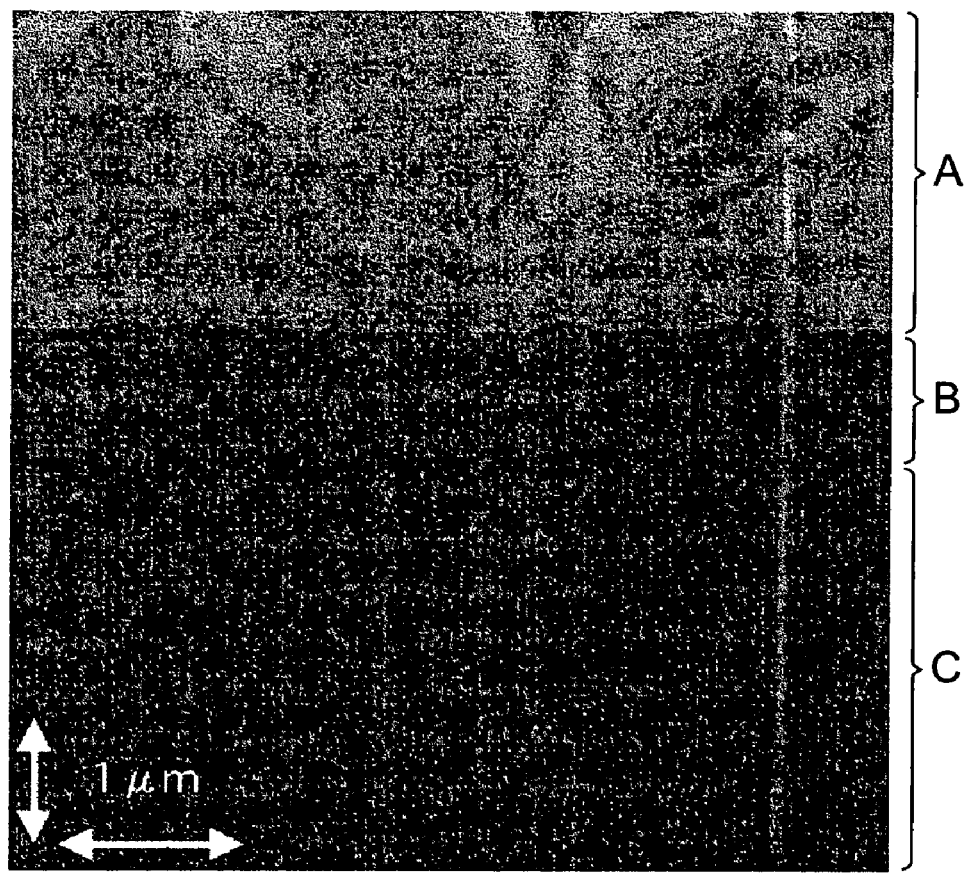
FIG. 5 is a FIB cross-sectional view of a double-sided copper-clad laminated sheet obtained using the resin primer of Embodiment 7.
Figure 6:
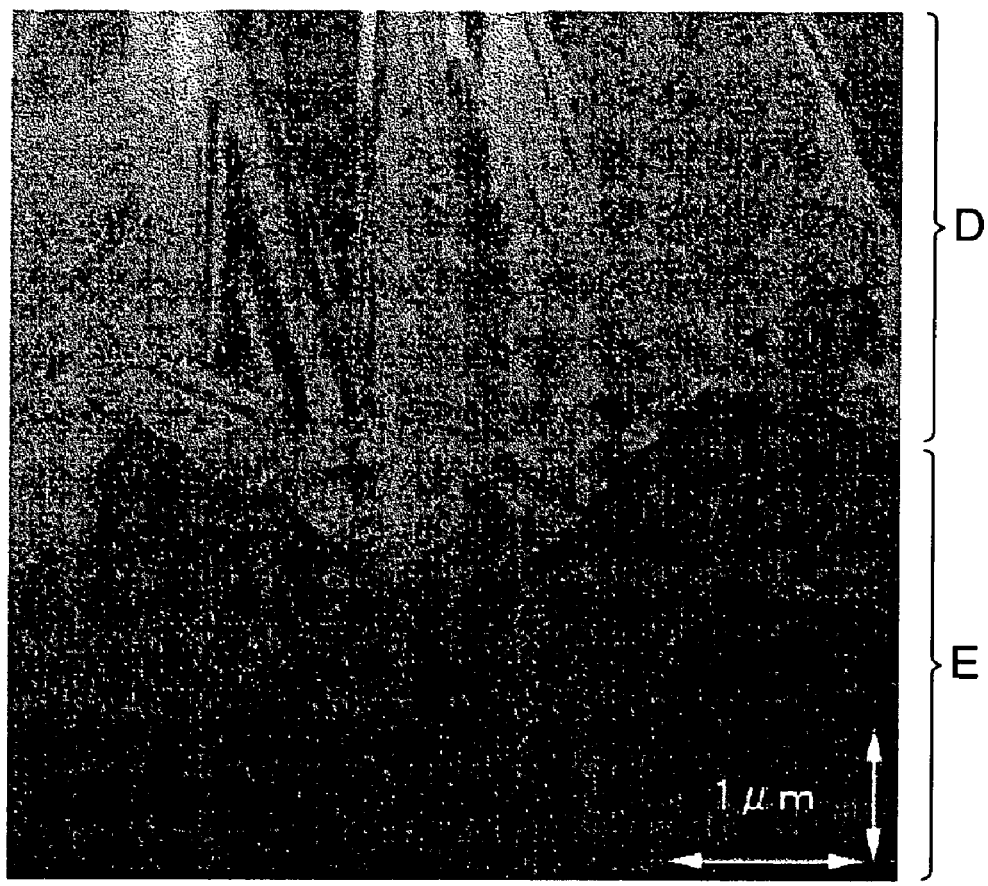
FIG. 6 is a FIB cross-sectional view of a commercial double-sided copper-clad laminated sheet.

Shape of Adhesion Interface:

A hole was fashioned by a FIB (focused ion beam) in the perpendicular direction (thickness direction) of the aforesaid double-sided copper-clad laminated sheets, and a scanning ion image (image of secondary electrons emitted by the ion beam) was observed from a direction of 45° from the formed hole. FIG. 5 is an FIB cross-sectional view of a double-sided copper-clad laminated sheet obtained using the resin primer of Example 7, and FIG. 6 is an FIB cross-sectional view of a commercial double-sided copper clad laminated sheet.

TABLE 4

| | Adhesive layer | | | | Imide substrate | | Low permitivity substrate | |
| --- | --- | --- | --- | --- | --- | --- | --- | --- |
| | Polyamideimide | Epoxy resin | Silicon amount | Amide group amount | Adhesive strength | Heat resistance | Adhesive strength | Heat resistance |
| Example 6 | Synthesis example 1 | DER331L | 8.25 | 7.65 | 0.8 | ○ | 0.8 | ○ |
| Example 7 | Synthesis example 2 | DER331L | 12.56 | 7.01 | 0.8 | ○ | 0.8 | ○ |
| Example 8 | Synthesis example 3 | YDCN500-10 | 10.44 | 5.81 | 0.8 | ○ | 0.8 | ○ |
| Example 9 | Synthesis example 1 | NC3000H | 7.81 | 7.25 | 0.8 | ○ | 0.8 | ○ |
| Example 10 | Synthesis example 2 | — | 13.26 | 7.38 | 0.8 | ○ | 0.8 | ○ |
| Comparative example 7 | Synthesis example 2 | DER331L | 5.3 | 2.95 | 0.3 | X | 0.2 | X |
| Comparative example 8 | Comparative Synthesis Example 1 | DER331L | 25.16 | 3.66 | 0.1 | X | 0.1 | X |
| Comparative example 9 | — | — | — | — | 0.3 | X | 0.2 | X |

From TABLE 4, it is seen that the bond strength of the copper foil of the double-sided copper-clad laminated sheet obtained using the resin primers of Examples 6-10 was 0.8 kN/m or more. In the solder heat resistance test, there was no swelling or peeling. Therefore, it had a good bond strength and solder heat resistance.

Also, from FIG. 5, in the copper clad laminates of the examples, the laminate of the copper foil A, adhesive layer B and base material C in a one-piece construction was very smooth as compared with the adhesion interface of the copper foil D and base material E in FIG. 6, which is the prior art laminated sheet. The thickness of the adhesive layer 2 between the copper foil 1 and base material 3 in the copper-clad laminate shown in FIG. 5 was 1-2 μm.

From this, in the resin primers of Examples 6-10, even when a metal foil having a smooth surface was used, a conductor-clad laminated sheet having excellent adhesion between the metal foil and base material could be obtained. It was thus confirmed that by using this conductor-clad laminated sheet, a printed circuit board with a fine circuit pattern can be manufactured.

Further, since the conductor-clad laminated sheet of the examples has a curing substance having a highly heat-resistant adhesive layer between the metal foil and base material, even when it is exposed to high temperature as in solder, it hardly ever swells. Due to this, a printed circuit board formed from the conductor-clad laminated sheet having such properties has a wiring circuit with a smooth surface, so higher frequency signals can be transmitted, and as a result electronic instruments with higher speed operation can be manufactured using this printed circuit board.

Synthesis of Polyamideimide

Synthesis Example 4

140 mmol of (4,4'-diamino)dicyclohexylmethane (Wondamine HM (abbreviated WHM): Shin Nippon Rika, Co., Ltd., trade name) as diamine compound, 35 mmol of Jeffamine D-2000 (San Techno Chemicals Co., Ltd., trade name), 368 mmol of TMA and 413 g of NMP as aprotic polar solvent were introduced into a separable 1 L flask fitted with a fixed amount water receiver, thermometer and stirrer connected to a reflux condenser, and the mixture stirred at 80° C. for 30 minutes.

After stirring was complete, 120 mL of toluene was added as an aromatic hydrocarbon which can form an azeotropic mixture with water, the temperature increased to 160° C. and the mixture refluxed for 2 hours. When it was found that the stoichiometric amount of water had accumulated in the fixed amount water receiver and no more water was observed to distil off, the temperature was increased to 190° C. while removing the water in the fixed amount water receiver, and toluene was thus removed.

After returning the solution in the flask to room temperature, 210 mmol of MDI was added as diisocyanate, the temperature increased to 190° C. and the mixture reacted for 2 hours. After the reaction, the solution was cooled to room temperature, and a solution of polyamideimide in NMP was thereby obtained.

Synthesis of Resin Primer

Example 11

76.0 g (solids content 25 wt %) of the solution of polyamideimide in NMP obtained in Synthesis Example 4, 2.0 g of DER331L which is an epoxy resin as the reactive compound (dimethylacetamide solution having a solids content of 50 wt %) and 1 wt % of 2-ethyl-4-methylimidazole relative to the reactive compound were blended, and this composition was stirred for about 1 hour until homogeneous. The solution was then left at room temperature for 2 hours for degassing, and a resin primer was thereby obtained.

Examples 12 and 13

A resin primer was obtained in an identical way to that of Example 11, except that the blending amount of DER331L was 4.2 g (Example 12) and 9.5 g (Example 13).

Comparative Examples 10-12

A resin primer was obtained in an identical way to that of Example 11, except that 63.3 g of PAI-100 (Hitachi Chemical Industries Co., Ltd., polyamideimide resin, resin solids content 30 wt %) was used, and the blending amounts of DER331L which is the reactive compound were respectively 2.0 g (Comparative Example 10), 4.2 g (Comparative Example 11) and 9.5 g (Comparative Example 12).

Copper Foil Peel Strength Measurement:

First, using the resin primers of Examples 11-13 and Comparative Examples 10-12, various kinds of double-sided copper-clad laminated sheets were manufactured according to the methods (1)-(3) described below.

In method (1), dimethylacetamide was added to each resin primer to give a solids content of 7 wt %, this was applied by natural flow casting to the glossy surface (Rz=2 μm) of an electrolytic copper foil, and the product was dried at 160° C. for 10 minutes in a hot air recirculation dryer so as to obtain a conductor foil with resin.

Next, 4 low permittivity prepregs GXA-67N (Hitachi Chemical Industries Co., Ltd.) were superimposed to manufacture a base material, the aforesaid copper foil with resin was superimposed on both sides with the resins (adhesive layers) in contact, and the assembly was compression bonded under the conditions of 230° C., 3.0 MPa for 90 minutes so as to manufacture a double-sided copper-clad laminated sheet.

In method (2), first, the resin primers were coated on a PET film, and dried at 160° C. for 10 minutes in a hot air recirculation dryer so as to obtain a film with resin. The thickness of the resin layer after drying was 8 μm.

Next, a resin layer formed by removing the PET film from the aforesaid film with resin, and electrolytic copper foil, were superimposed in this order on both sides of a base material of 4 low permittivity prepregs GXA-67N, and the assembly was compression bonded under the conditions of 230° C., 3.0 MPa for 90 minutes so as to manufacture a double-sided copper-clad laminated sheet. The glossy surface of the electrolytic copper foil was disposed in contact with the resin layer.

In method (3), first, the aforesaid resin primers were applied by natural flow casting on the low permittivity prepreg GXA-67N, and dried at 160° C. for 10 minutes in a hot air recirculation dryer so as to obtain a prepreg with resin. The thickness of the resin layer after drying was 1-2 μm.

Next, the aforesaid prepreg with resin was superimposed on both sides of a base material of 4 low permittivity prepregs GXA-67N with the prepreg layer in contact with the base material, an electrolytic copper foil was superimposed on the outer resin layer, and these components were compression bonded under the conditions of 230° C., 3.0 MPa for 90 minutes so as to manufacture a double-sided copper-clad laminated sheet. The glossy surface of the electrolytic copper foil was disposed in contact with the resin layer.

As Comparative Example 13, an electrolytic copper foil without resin (adhesive layer) was compression bonded to a laminate comprising a predetermined number of the aforesaid prepregs so as to manufacture a double-sided copper-clad laminated sheet.

The copper foil peel strength (kN/m) was measured by measuring the peel strength (based on 90° peel strength, JIS C6481) when the copper foils in the obtained double-sided copper-clad laminated sheets were respectively peeled off in a 90° direction. The copper foil peel strength after a double-sided copper-clad laminated sheet obtained in the same way was left in a thermostat bath at 121° C., 100RH for 2 hours (PCT treatment), was measured in an identical manner. TABLE 5 shows the obtained results.

Solder Heat Resistance Evaluation:

The aforesaid double-sided copper clad laminated sheets were cut to 5 mm×5 mm, the copper foil on both sides was etched to leave half the surface area, and the sample was immersed in a 260° C. solder bath for 20 seconds. At this time, the sample was checked visually for swelling at the adhesion interface of copper foil and base material. The same test was performed for double-sided copper-clad laminated sheets after PCT treatment. Sheets for which swelling was not observed were marked O and deemed to have excellent solder heat resistance, whereas sheets for which swelling was observed were marked X and deemed to have inferior solder heat resistance. TABLE 5 shows the obtained results.

TABLE 5

|  | Method of manufacturing laminated sheet | Copper foil peel strength | | Solder heat resistance | |
| --- | --- | --- | --- | --- | --- |
|  |  | Initial stage | After PCT | Initial stage | After PCT |
| Example 11 | (1) | 0.8 | 0.8 | O | O |
|  | (2) | 0.8 | 0.7 | O | O |
|  | (3) | 0.8 | 0.8 | O | O |
| Example 12 | (1) | 0.8 | 0.7 | O | O |
|  | (2) | 0.8 | 0.8 | O | O |
|  | (3) | 0.8 | 0.7 | O | O |
| Example 13 | (1) | 0.9 | 0.8 | O | O |
|  | (2) | 0.8 | 0.7 | O | O |
|  | (3) | 0.7 | 0.7 | O | O |
| Comparative example 10 | (1) | 0.2 | 0.2 | X | X |
|  | (2) | 0.1 | 0.1 | X | X |
|  | (3) | 0.1 | 0.1 | X | X |
| Comparative example 11 | (1) | 0.2 | 0.1 | X | X |
|  | (2) | 0.1 | 0.1 | X | X |
|  | (3) | 0.1 | 0.1 | X | X |
| Comparative example 12 | (1) | 0.1 | 0.1 | X | X |
|  | (2) | 0.1 | 0.1 | X | X |
|  | (3) | 0.1 | 0.1 | X | X |
| Comparative example 13 | — | 0.2 | 0.1 | O | X |

From TABLE 5, it is seen that in the double-sided copper-clad laminated sheets obtained using the resin primers of Examples 11-13, even for a copper foil having a smooth surface, adhesion with the base material was very good. These double-sided copper-clad laminated sheets had excellent solder heat-resistance. The solder heat-resistance was maintained even when the sheets was stored in a high humidity, high temperature environment.

Evaluation of Solder Heat Resistance of Inner Layer Adhesive Layer:

First, after obtaining various kinds of double-sided copper clad laminated sheets as in the aforesaid method (1), the copper foil in this laminated sheet was removed by etching to obtain an inner layer board. Next, among the resin primers of Examples 11-13 and Comparative Examples 10-12, the same ingredients (i.e., the same primers) as those of the resin layer exposed on the surface of the inner layer board were respectively applied by natural flow casting to one side of each inner layer board, and dried at 160° C. for 10 minutes. The thickness of the resin layer (inner layer adhesive layer) comprising the resin primer after drying was 2-3 μm.

Next, one sheet of GEA-679 (Hitachi Chemical Industries Co., Ltd.) which is a prepreg was superimposed on the resin layer (inner layer adhesive layer) formed on the inner layer board surface, the obtained laminate was compression bonded under the conditions of 180° C., 70 minutes, 2.5 MPa, and a laminate for evaluating the heat resistance of the inner layer adhesive layer was thus obtained.

As Comparative Example 14, a double-sided copper-clad laminated sheet was formed by compression bonding of an electrolytic copper foil without a resin (adhesive layer) to a base material comprising 4 superimposed GEA-679, the copper foil of this double-sided copper-clad laminated sheet was etched, GEA-679 was laminated on one side, and compression bonded under the aforesaid press conditions to manufacture a laminate.

These laminates were cut to 5 mm×5 mm to manufacture solder heat resistance evaluation samples, the obtained samples were immersed in a 260° C. solder bath for 20 seconds, and the samples were checked visually for swelling at the interface of the outer layer prepreg (GEA-679) and base material. The same test was performed for double-sided copper-clad laminated sheets at 1 hour and 2 hours after PCT treatment. Sheets for which swelling was not observed were marked O and deemed to have excellent solder heat resistance, whereas sheets for which swelling was observed were marked X and deemed to have inferior solder heat resistance. TABLE 6 shows the obtained results.

TABLE 6

|  | Solder heat resistance of inner-layer adhesive layer | | |
| --- | --- | --- | --- |
|  | Initial stage | 1 hour after PCT | 2 hours after PCT |
| Example 11 | O | O | O |
| Example 12 | O | O | O |
| Example 13 | O | O | O |
| Comparative example 10 | X | X | X |
| Comparative example 11 | X | X | X |
| Comparative example 12 | X | X | X |
| Comparative example 14 | O | X | X |

From TABLE 6, it is seen that even if the resin primers of Examples 11-13 were used as the adhesive layer of the inner layer in the laminated sheet, excellent solder heat resistance was obtained.

Measurement of Transmission Loss of Printed Circuit Board:

The copper foil in the double-sided copper clad laminated sheet obtained by the aforesaid method (3) using the resin primer of Example 11 was etched, and a circuit board having a conductor with a straight line pattern was obtained. A signal having a frequency of 0.1-10 GHz was transmitted to the conductor of this circuit board, and the transmission loss was measured.

Transmission loss was measured in an identical way for a circuit board obtained as above except that copper foil having Rz=5.0 μm was used.

Figure 7:
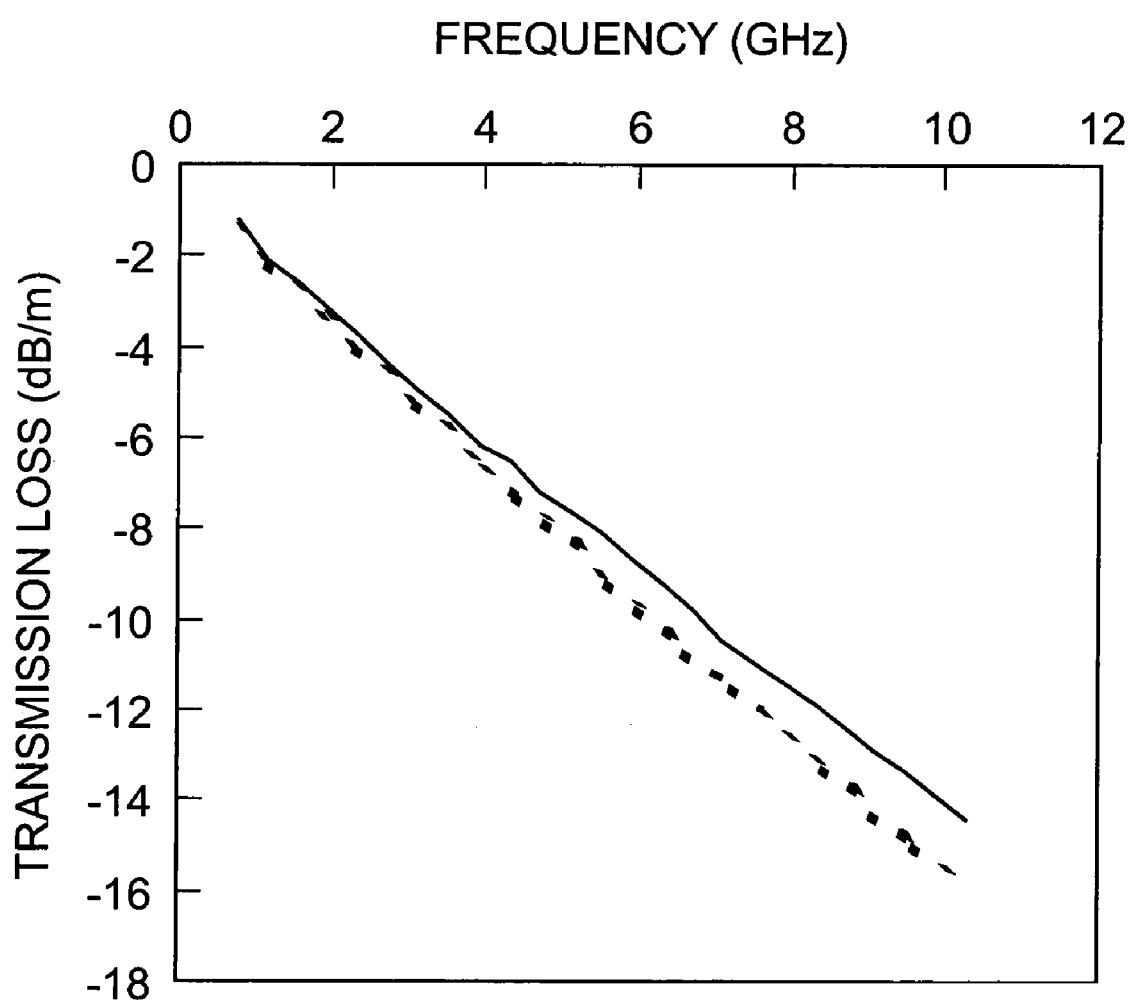
FIG. 7 is a graph showing the value of a transmission loss relative to a signal frequency.

FIG. 7 is a graph showing the value of the transmission loss relative to the signal frequency when these circuit boards are used. In FIG. 7, the solid line shows a copper foil having Rz=2.0 μm, and the dotted line shows a copper foil having Rz=5.0 μm. From FIG. 7, it is seen that transmission loss is smaller for the circuit board obtained using copper foil having Rz=2 μm than for the circuit board having Rz=5 μm.

Evaluation of Fine Pattern-Forming:

The fine pattern-forming property was evaluated for various kinds of double-sided copper-clad laminated sheets obtained by the aforesaid methods (1)-(3) using the resin primers of Examples 11-13 and Comparative Examples 10-12, and the double-sided copper-clad laminated sheet of Comparative Example 13. Specifically, NIT-215 (Nippon Synthetic Chemical Co., Ltd., thickness 15 μm) was first laminated by lamination as a resist on a copper foil which was to form a circuit on each double-sided copper-clad laminated sheet. Next, an etching resist having a comb type pattern in which lines/spaces were respectively 20/20, 30/30, 50/50, 75/75, 100/100 was formed by exposing and developing. Next, after etching unnecessary parts of copper foil by ferric chloride aqueous solution, the etching resist was peeled off to form a comb-like circuit pattern. The top interval, bottom interval and presence or absence of etching residue in the obtained circuit pattern, were observed with an optical microscope.

As a result, for the double-sided copper-clad laminated sheets obtained using the resin primers of Examples 11-13, it was possible to form a pattern with lines/spaces=20/20 (μm). On the other hand, using the resin primers of Comparative Examples 10-12 and Comparative Example 13, if it was attempted to form such a pattern, peeling of the conductor pattern occurred. Hence, using the resin primers of Examples 11-13, the conductor foil could be properly stuck to the substrate even if the conductor foil had a fine pattern.

INDUSTRIAL APPLICABILITY

According to the invention, a resin primer, a conductor foil with resin and a laminated sheet wherein sufficiently strong adhesion can be obtained between an insulator layer and a conductor foil in which the surface has not been very much roughened, can be provided.

The invention claimed is:

1. A conductor foil with resin comprising a conductor foil and a resin layer provided on said conductor foil, wherein:
the 10 point average roughness of the surface of said conductor foil is 3 μm or less; and
said resin layer is formed by coating a resin primer containing a resin, wherein said resin has film-forming ability, and contains a polyamideimide having a structural unit expressed by the following chemical formula (5):

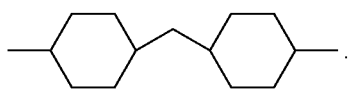
(5)

2. The conductor foil with resin according to claim 1, wherein said polyamideimide is obtained by the reaction of a diimide-dicarboxylic acid, obtained by reacting a diamine compound and anhydrous trimellitic acid, with a diisocyanate, the diamine compound being expressed by the following general formulae (6a), (6b) or (6c):

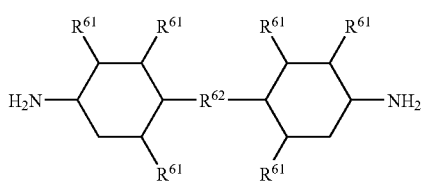
(6a)

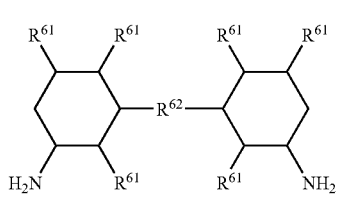
(6b)

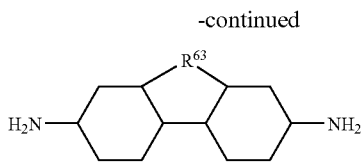
(6c)

[in the formulae, $R^{61}$ is a hydrogen atom, or a hydroxyl, methoxy, methyl or halogenated methyl group, $R^{62}$ is one of the groups expressed by the following general formulae (7a), (7b), (7c) or (7d), an alkylene group having 1-3 carbon atoms, a halogenated alkylene group having 1-3 carbon atoms, a sulfonyl group, an ether group, a carbonyl group or a single bond, and $R^{63}$ is an alkylene group having 1-3 carbon atoms, a halogenated alkylene group having 1-3 carbon atoms, a sulfonyl group, an ether group or a carbonyl group:

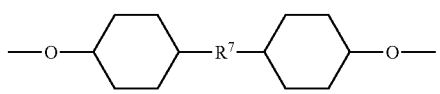
(7a)

(7b)

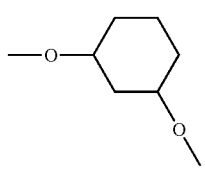
(7c)

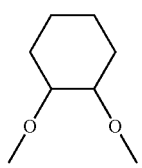
(7d)

where, in formula (7a), $R^7$ is an alkylene group having 1-3 carbon atoms, a halogenated alkylene group having 1-3 carbon atoms, a sulfonyl group, an ether group, a carbonyl group or a single bond, and the plural $R^{61}$ may be respectively identical or different].

3. The conductor foil with resin according to claim 2, which further contains the compound expressed by the following general formula (8) as said diamine compound:

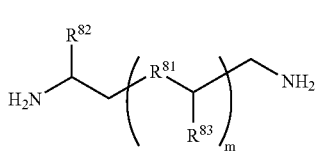
(8)

[in the formula, $R^{81}$ is a methylene group, sulfonyl group, ether group, carbonyl group or single bond, $R^{82}$ and $R^{83}$ are respectively a hydrogen atom, alkyl group, phenyl group or substituted phenyl group, and m is an integer from 1-50].

4. The conductor foil with resin primer according to claim 2, which contains an aromatic diisocyanate as said diisocyanate.

5. The conductor foil with resin according to claim 1, wherein said polyamideimide is obtained by the reaction of a diimide-dicarboxylic acid, obtained by reacting a diamine compound and anhydrous trimellitic acid, with a diisocyanate.

6. The conductor foil with resin according to claim 1, further containing a reactive compound having a functional group which reacts with an amide group of said polyamideimide.

7. The conductor foil with resin according to claim 1, wherein the contact angle of formamide at room temperature with respect to a film surface of a film is 60° or less in the case where the film which has a 10 point average roughness of 0.1 μm or less is formed from said resin.

8. The conductor foil with resin according to claim 1, wherein said resin contains 6 mass % or more of one or more bonds selected from a group consisting of an imide bond, carbamate bond and aromatic carboxylic acid ester bond based on the mass of said resin.

9. The conductor foil with resin according to claim 1, further containing a rubber ingredient, wherein said rubber ingredient content is 40 mass % or more based on the mass of said resin.

10. A laminated sheet obtained by heating and pressurizing a laminate comprising the conductor foil with resin according to claim 1 and a prepreg laminated on said resin layer of said conductor foil with resin.

11. A laminated sheet, comprising:
a conductor foil;
an insulating layer containing a resin disposed facing said conductor foil;
and a resin layer comprising a resin primer containing a resin, wherein said resin of the resin primer has film-forming ability, and contains a polyamideimide having a structural unit expressed by the following chemical formula (5):

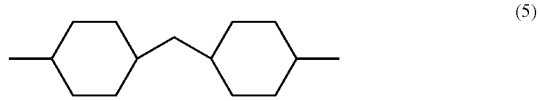

(5)

and wherein the resin layer is disposed between said conductor foil and said insulating layer so that it is in contact therewith, and the 10 point average roughness of at least the surface of the conductor foil in contact with said resin layer is 3 μm or less.

* * * * *